(12) United States Patent
Moriya et al.

(10) Patent No.: US 9,363,878 B2
(45) Date of Patent: Jun. 7, 2016

(54) DEVICE FOR CONTROLLING LASER BEAM AND APPARATUS FOR GENERATING EXTREME ULTRAVIOLET LIGHT UTILIZING WAVEFRONT ADJUSTERS

(71) Applicant: GIGAPHOTON INC., Tochigi (JP)

(72) Inventors: Masato Moriya, Tochigi (JP); Osamu Wakabayashi, Kanagawa (JP)

(73) Assignee: GIGAPHOTON INC., Tochigi (JP)

( * ) Notice: Subject to any disclaimer, the term of this patent is extended or adjusted under 35 U.S.C. 154(b) by 58 days.

(21) Appl. No.: 14/327,401

(22) Filed: Jul. 9, 2014

(65) Prior Publication Data

US 2015/0334814 A1 Nov. 19, 2015

Related U.S. Application Data

(63) Continuation of application No. PCT/IB2012/002781, filed on Dec. 21, 2012.

(30) Foreign Application Priority Data

Jan. 11, 2012 (JP) ................. 2012-003089
Dec. 7, 2012 (JP) ................. 2012-268262

(51) Int. Cl.
*H05G 2/00* (2006.01)
*H01S 3/13* (2006.01)
*H01S 3/10* (2006.01)
*H01S 3/00* (2006.01)
*G02B 19/00* (2006.01)
*B23K 26/06* (2014.01)
(Continued)

(52) U.S. Cl.
CPC ............ *H05G 2/008* (2013.01); *B23K 26/06* (2013.01); *G02B 19/009* (2013.01); *G03F 7/70033* (2013.01); *H01S 3/0071* (2013.01); *H01S 3/005* (2013.01); *H01S 3/2316* (2013.01)

(58) Field of Classification Search
CPC ......... H05G 2/00; G03F 7/70033; H01S 3/10; H01S 3/1305; H01S 3/1307; H01S 3/034
See application file for complete search history.

(56) References Cited

U.S. PATENT DOCUMENTS

2002/0141471 A1* 10/2002 Aab .................... H01S 3/0811
 372/57
2010/0078577 A1 4/2010 Moriya et al.
2010/0117009 A1 5/2010 Moriya et al.
(Continued)

OTHER PUBLICATIONS

International Search Report issued in International Application No. PCT/IB2012/002781 dated Jul. 24, 2014.
(Continued)

*Primary Examiner* — Robert Kim
*Assistant Examiner* — Sean Luck
(74) *Attorney, Agent, or Firm* — Studebaker & Brackett PC

(57) ABSTRACT

A device is provided for controlling a laser beam. The device may include a first wavefront adjuster provided in a beam path of a laser beam outputted from a laser apparatus, a beam delivery unit provided in a beam path of the laser beam from the first wavefront adjuster, a second wavefront adjuster provided in a beam path of the laser beam from the beam delivery unit, a beam monitor provided in a beam path of the laser beam from the second wavefront adjuster, and a controller configured to control the first and second wavefront adjusters based on a detection result of the beam monitor. An extreme ultraviolet light apparatus including the device is also provided.

17 Claims, 30 Drawing Sheets

(51) Int. Cl.
*G03F 7/20* (2006.01)
*H01S 3/23* (2006.01)

(56) References Cited

U.S. PATENT DOCUMENTS

2010/0127191 A1  5/2010  Partlo et al.
2010/0232007 A1*  9/2010  Byren ................. F41H 13/005
                                                    359/291
2011/0140008 A1  6/2011  Bergstedt et al.

OTHER PUBLICATIONS

T. Weyrauch et al., "Atmospheric compensation over a 2.3 km propagation path with a multi-conjugate (piston-MEMS/modal DM) adaptive system," SPIE, vol. 5552, 2004, pp. 73-84.

International Search Report issued in International Application No. PCT/IB2012/002781 mailed May 8, 2013.

* cited by examiner

US 9,363,878 B2

DEVICE FOR CONTROLLING LASER BEAM AND APPARATUS FOR GENERATING EXTREME ULTRAVIOLET LIGHT UTILIZING WAVEFRONT ADJUSTERS

CROSS-REFERENCE TO RELATED APPLICATIONS

The present application is a continuation of International Application No. PCT/IB2012/002781, filed on Dec. 21, 2012, which claims priority from Japanese Patent Application No. 2012-003089 filed Jan. 11, 2012 and Japanese Patent Application No. 2012-268262 filed Dec. 7, 2012, the disclosures of which are incorporated by reference herein.

BACKGROUND

1. Technical Field

The present disclosure relates to a device for controlling a laser beam and an apparatus for generating extreme ultraviolet (EUV) light.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating EUV light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

A device for controlling a laser beam according to one aspect of the present disclosure may include a first wavefront adjuster provided in a beam path of a laser beam outputted from a laser apparatus, a beam delivery unit provided in a beam path of the laser beam from the first wavefront adjuster, a second wavefront adjuster provided in a beam path of the laser beam from the beam delivery unit, a beam monitor provided in a beam path of the laser beam from the second wavefront adjuster, and a controller configured to control the first and second wavefront adjusters based on a detection result of the beam monitor.

An apparatus for generating extreme ultraviolet light according to another aspect of the present disclosure may include a laser beam control device which includes a first wavefront adjuster provided in a beam path of a laser beam outputted from a laser apparatus, a beam delivery unit provided in a beam path of the laser beam from the first wavefront adjuster, a second wavefront adjuster provided in a beam path of the laser beam from the beam delivery unit, a beam monitor provided in a beam path of the laser beam from the second wavefront adjuster, and a controller configured to control the first and second wavefront adjusters based on a detection result of the beam monitor, a chamber provided with an inlet to allow the laser beam from the laser beam control device to enter the chamber therethrough, a target supply device for supplying a target material into the chamber, and a laser beam focusing optical system for focusing the laser beam in the chamber.

BRIEF DESCRIPTION OF THE DRAWINGS

Hereinafter, selected embodiments of the present disclosure will be described with reference to the accompanying drawings.

DETAILED DESCRIPTION

Figure 1:
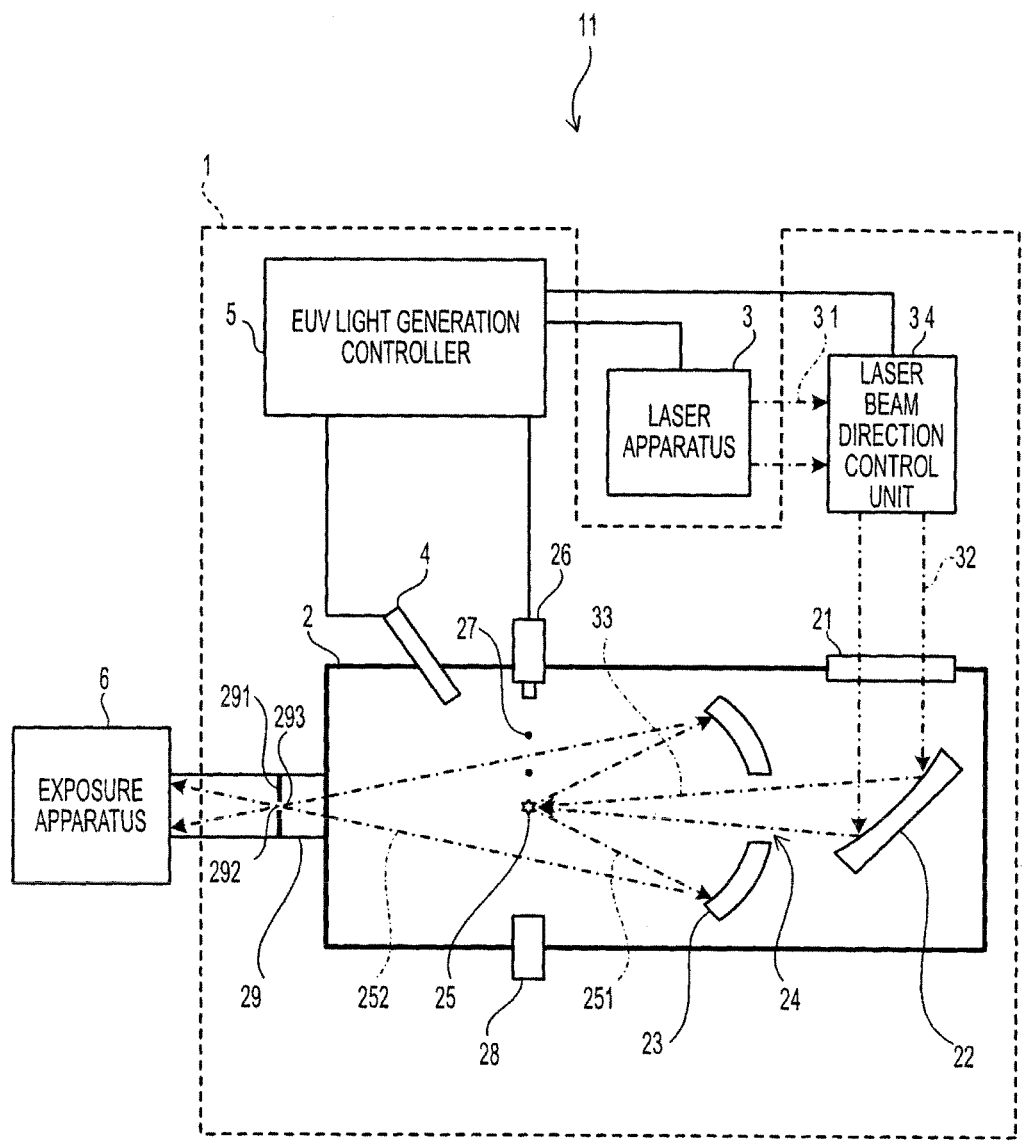
FIG. 1 schematically illustrates a configuration of an exemplary LPP-type EUV light generation system.

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

CONTENTS

1. Overview
2. Overview of EUV Light Generation System
2.1 Configuration
2.2 Operation
3. EUV Light Generation System Including Wavefront Adjusters: First Embodiment
3.1 Configuration
3.2 Mechanism
3.3 Operation
3.3.1 Main Flow
3.3.2 Control of First Wavefront Adjuster (Details of S100)
3.3.3 Control of Second Wavefront Adjuster (Details of S200)
3.4 Examples of Beam Monitor
3.4.1 Detecting Beam Width at Two Difference Positions
3.4.2 Detecting Beam Width and Beam Spot width
3.4.3 Using Shack-Hartmann Wavefront Sensor
3.5 Examples of Wavefront Adjuster
3.5.1 Combination of Convex Mirror and Concave Mirror
3.5.2 Combination of Concave Mirror and Convex Mirror
3.5.3 Combination of Two Off-Axis Paraboloidal Concave Mirrors
3.5.4 Combination of Off-Axis Paraboloidal Convex Mirror and Off-Axis Paraboloidal Concave Mirror
3.5.5 Using VRM
3.5.6 Using Deformable Mirror
4. EUV Light Generation System Including Guide Laser Device: Second Embodiment
4.1 Configuration
4.2 Examples of Beam Monitor
4.2.1 Detecting Beam Width at Two Difference Positions
4.2.2 Detecting Beam Width and Beam Spot width
4.2.3 Using Shack-Hartmann Wavefront Sensor
4.3 Operation
4.4 Arrangement of Laser Amplifiers
5. EUV Light Generation System where Wavefront of Guide Laser Beam Is Adjusted to Wavefront of Laser Beam: Third Embodiment
5.1 Configuration
5.2 Operation
6. EUV Light Generation System where Wavefront of Laser Beam Is Adjusted to Wavefront of Guide Laser Beam: Fourth Embodiment
7. EUV Light Generation System where Wavefront of Laser Beam and Wavefront of Guide Laser Beam Are Adjusted:

Fifth Embodiment
8. EUV Light Generation System Including Pre-pulse Laser Apparatus: Sixth Embodiment
9. Configuration of Controller

1. Overview

In an LPP-type EUV light generation system, a target material supplied into a chamber may be irradiated with a laser beam outputted from a laser apparatus to thereby be turned into plasma. Then, light including EUV light may be emitted from the plasma. The emitted EUV light may be collected by an EUV collector mirror provided inside the chamber, and outputted to an external apparatus such as an exposure apparatus.

A beam delivery unit that includes optical elements provided in a beam path from the laser apparatus to the chamber may be heated as the optical elements absorb energy of the laser beam. As a result, the optical elements may deform and the wavefront of the laser beam may fluctuate. Then, the spot size or the focus position of the laser beam may fluctuate as well, and the EUV light may be unstably outputted to the external apparatus.

According to one aspect of the present disclosure, wavefront adjusters may be provided respectively upstream and downstream from a beam delivery unit. A laser beam outputted from the downstream-side wavefront adjuster may be detected by a monitor, and the wavefront adjusters may be controlled accordingly based on the detection result.

2. Overview of EUV Light Generation System

2.1 Configuration

FIG. 1 schematically illustrates a configuration of an exemplary LPP type EUV light generation system. An EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation system 11 may include a chamber 2 and a target supply device 26. The chamber 2 may be sealed airtight. The target supply device 26 may be mounted onto the chamber 2 to penetrate a wall of the chamber 2. A target material supplied by the target supply device 26 may include, but is not limited to, tin, terbium, gadolinium, lithium, xenon, or any combination thereof.

The chamber 2 may have at least one through-hole or opening formed in its wall, and a pulse laser beam 32 may travel through the through-hole/opening into the chamber 2. Alternatively, the chamber 2 may have a window 21, through which the pulse laser beam 32 may travel into the chamber 2. An EUV collector mirror 23 having a spheroidal surface may be provided in the chamber 2. The EUV collector mirror 23 may have a multi-layered reflective film formed on the spheroidal surface thereof. The reflective film may include a molybdenum layer and a silicon layer, which are alternately laminated. The EUV collector mirror 23 may have a first focus and a second focus, and may be positioned such that the first focus lies in a plasma generation region 25 and the second focus lies in an intermediate focus (IF) region 292 defined by the specification of an external apparatus, such as an exposure apparatus 6. The EUV collector mirror 23 may have a through-hole 24 formed at the center thereof, and a pulse laser beam 33 may travel through the through-hole 24 toward the plasma generation region 25.

The EUV light generation system 11 may further include an EUV light generation controller 5 and a target sensor 4. The target sensor 4 may have an imaging function and detect at least one of the presence, the trajectory, the position, and the speed of a target 27.

Further, the EUV light generation system 11 may include a connection part 29 for allowing the interior of the chamber 2 to be in communication with the interior of the exposure apparatus 6. A wall 291 having an aperture 293 may be provided in the connection part 29, and the wall 291 may be positioned such that the second focus of the EUV collector mirror 23 lies in the aperture 293 formed in the wall 291.

The EUV light generation system 11 may also include a laser beam direction control unit 34, a laser beam focusing mirror 22, and a target collector 28 for collecting targets 27. The laser beam direction control unit 34 may include an optical element (not separately shown) for defining the direction into which the pulse laser beam 32 travels and an actuator (not separately shown) for adjusting the position and the orientation or posture of the optical element.

2.2 Operation

With continued reference to FIG. 1, a pulse laser beam 31 outputted from the laser apparatus 3 may pass through the laser beam direction control unit 34 and be outputted therefrom as a pulse laser beam 32 after having its direction optionally adjusted. The pulse laser beam 32 may travel through the window 21 and enter the chamber 2. The pulse laser beam 32 may travel inside the chamber 2 along at least one beam path from the laser apparatus 3, be reflected by the laser beam focusing mirror 22, and strike at least one target 27 as a pulse laser beam 33.

The target supply device 26 may be configured to output the target(s) 27 toward the plasma generation region 25 in the chamber 2. The target 27 may be irradiated with at least one pulse of the pulse laser beam 33. Upon being irradiated with the pulse laser beam 33, the target 27 may be turned into plasma, and rays of light 251 including EUV light may be emitted from the plasma. At least the EUV light included in the light 251 may be reflected selectively by the EUV collector mirror 23. EUV light 252, which is the light reflected by the EUV collector mirror 23, may travel through the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control at least one of the timing at which the target 27 is outputted and the direction into which the target 27 is outputted. Furthermore, the EUV light generation controller 5 may be configured to control at least one of the timing at which the laser apparatus 3 oscillates, the direction in which the pulse laser beam 31 travels, and the position at which the pulse laser beam 33 is focused. It will be appreciated that the various controls mentioned above are merely examples, and other controls may be added as necessary.

3. EUV Light Generation System Including Wavefront Adjusters

First Embodiment

3.1 Configuration

Figure 2:
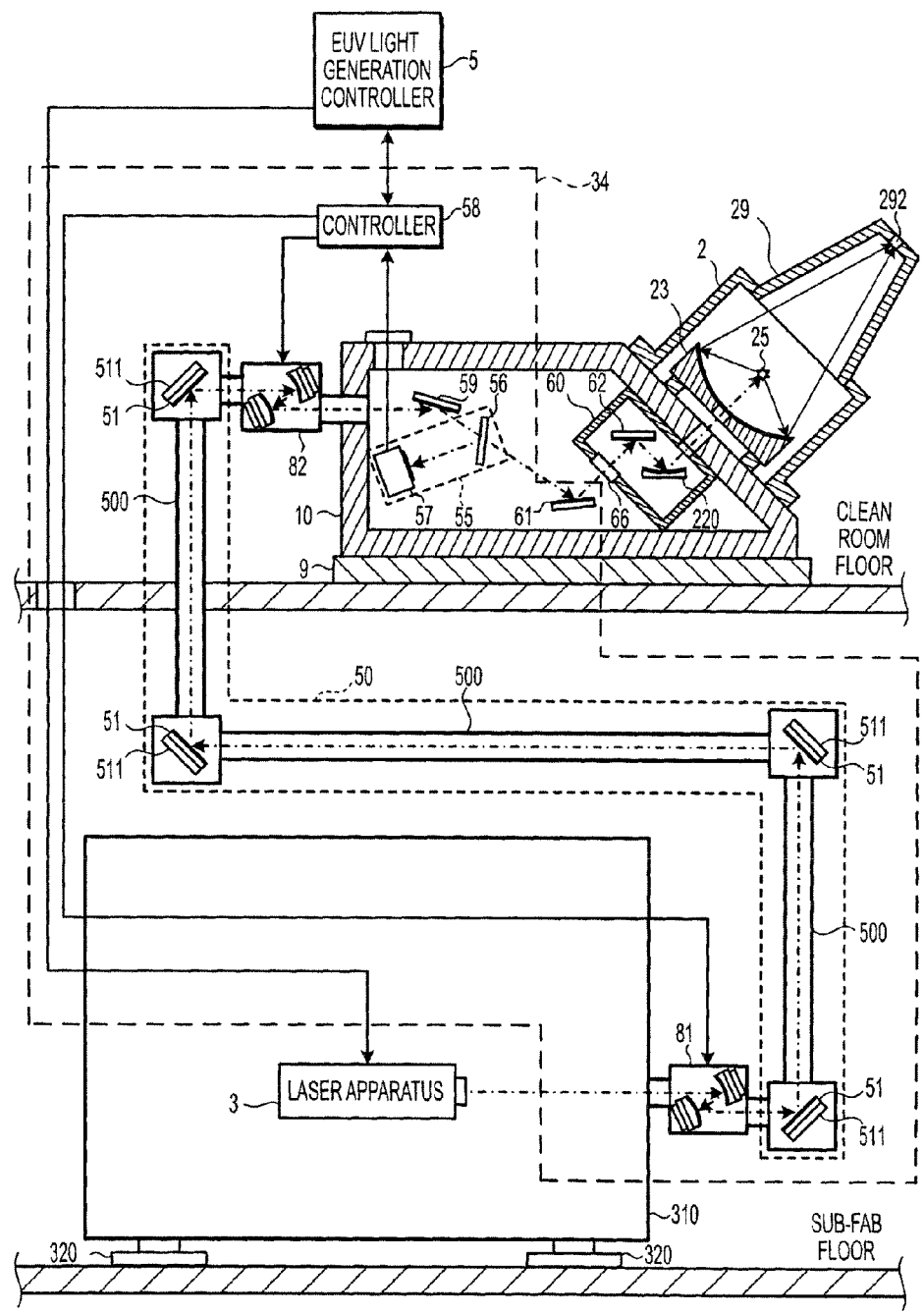
FIG. 2 is a partial sectional view illustrating an exemplary configuration of an EUV light generation system according to a first embodiment of the present disclosure.

FIG. 2 is a partial sectional view illustrating an exemplary configuration of an EUV light generation system according to a first embodiment of the present disclosure. In the first embodiment, the chamber 2 may be installed in a clean room floor, and the laser apparatus 3 may be installed in a sub-fab floor. The sub-fab floor may be located downstairs from the clean room floor. The laser beam direction control unit 34 may be provided across the clean room floor and the sub-fab floor to control a direction in which a laser beam travels from the laser apparatus 3 to the chamber 2. The laser apparatus 3 may be secured inside a housing 310 by a fixing device (not separately shown). The housing 310 may be installed on a floor in the sub-fab floor through a plurality of air suspensions 320.

In the sub-fab floor, the laser beam direction control unit 34 may include a first wavefront adjuster 81. The first wavefront adjuster 81 may include a plurality of mirrors or a plurality of lenses. Alternatively, the first wavefront adjuster 81 may includes a mirror and a lens. The first wavefront adjuster 81 may be provided in a beam path of a laser beam outputted from the laser apparatus 3.

In a region across the sub-fab floor and the clean room floor, the laser beam direction control unit 34 may include a beam delivery unit 50. The beam delivery unit 50 may include hollow optical path pipes 500. Each of the optical path pipes 500 may be a vacuum pipe, or dry air or an inert gas may be introduced into the optical path pipes 500. The beam delivery unit 50 may include a plurality of high-reflection mirrors 51, and the high-reflection mirrors 51 may be arranged so that a laser beam from the first wavefront adjuster 81 is guided into the clean room floor. The high-reflection mirrors 51 may be supported by respective mirror holders 511.

The chamber 2 may be secured on a chamber reference member 10 in the clean room floor. The chamber reference member 10 may be fixed on a floor in the clean room floor through an installation mechanism 9. Optical elements constituting a part of the laser beam direction control unit 34 may be housed in the chamber reference member 10.

In the clean room floor, the laser beam direction control unit 34 may include a second wavefront adjuster 82, an optical detector 55, a controller 58, and high-reflection mirrors 59 and 61. The optical detector 55 and the high-reflection mirrors 59 and 61 may be housed in the chamber reference member 10.

The second wavefront adjuster 82 may include a plurality of mirrors or a plurality of lenses. Alternatively, the second wavefront adjuster 82 may includes a mirror and a lens. The second wavefront adjuster 82 may be provided in a beam path of a laser beam guided into the clean room floor through the beam delivery unit 50.

The high reflection mirror 59 may be positioned to reflect a laser beam from the second wavefront adjuster 82 toward the optical detector 55. The optical detector 55 may include a beam splitter 56 and a first beam monitor 57. The beam splitter 56 may be configured and positioned to transmit a laser beam from the high-reflection mirror 59 toward the high-reflection mirror 61 with high transmittance and reflect a part of a laser beam from the high-reflection mirror 59 toward the first beam monitor 57 as a sample beam. The first beam monitor 57 may be positioned so that a sample beam is incident on its photosensitive surface. The first beam monitor 57 may be configured to obtain parameters for calculating a beam width and a wavefront curvature of a sample beam at the photosensitive surface thereof and output a detection result to the controller 58.

The controller 58 may calculate the beam width and the wavefront curvature of the sample beam based on the detection result received from the first beam monitor 57. Then, the controller 58 may carry out feedback control on the first wavefront adjuster 81 and the second wavefront adjuster 81 based on a calculation result so that a subsequent sample beam will have a beam width and a wavefront curvature that respectively fall within predetermined ranges at the photosensitive surface of the first beam monitor 57. Details of this control will be given later.

The high-reflection mirror 61 may be positioned to reflect a laser beam from the beam splitter 56 toward a mirror housing 60. A window 66 may be provided in the mirror housing 60, and a laser beam from the high-reflection mirror 61 may be transmitted through the window 66 with high transmittance. A laser beam that has entered the mirror housing 60 may be reflected by a flat mirror 62 with high reflectance, reflected by a laser beam focusing mirror 220 with high reflectance, and focused on a target supplied to the plasma generation region 25.

3.2 Mechanism

Figure 3A:
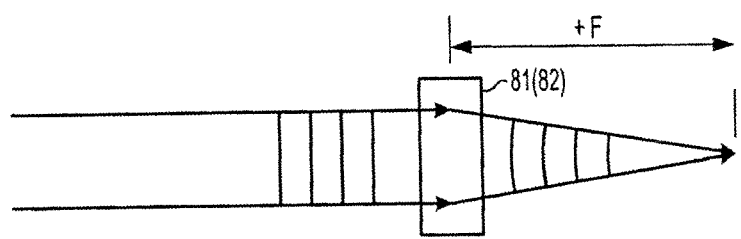
FIG. 3A is a diagram for discussing functions of a wavefront adjuster.
Figure 3B:
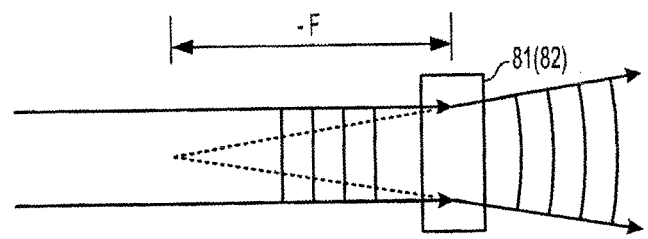
FIG. 3B is another diagram for discussing functions of a wavefront adjuster.

FIGS. 3A and 3B are diagrams for discussing functions of a wavefront adjuster. Each of the first wavefront adjuster 81 and the second wavefront adjuster 82 may be an optical element to adjust a wavefront of a laser beam. In FIG. 3A, the first wavefront adjuster 81 or the second wavefront adjuster 82 converts a laser beam having a planar wavefront into a laser beam having a concave wavefront. In FIG. 3B, the first wavefront adjuster 81 or the second wavefront adjuster 82 converts a laser beam having a planar wavefront into a laser beam having a convex wavefront.

That is, each of the first wavefront adjuster 81 and the second wavefront adjuster 82 may be an optical element that is capable of converting a wavefront of a laser beam as shown in FIG. 3A or as shown in FIG. 3B. Further, each of the first wavefront adjuster 81 and the second wavefront adjuster 82 may be capable of converting a wavefront having a given curvature into a wavefront having another given curvature.

When a wavefront adjuster has a focal length F, an optical power P of the wavefront adjuster may be expressed in the following expression.

$$P = 1/F$$

When F is positive, a collimated laser beam may be converted into such a laser beam having a concave wavefront that is focused at a point distanced, in the travel direction of the laser beam, by the focal length F from the principal point of the wavefront adjuster (see FIG. 3A). When F is negative, a collimated laser beam may be converted into a laser beam having a convex wavefront that is equivalent to a wavefront of light emitted from a point light source at a position distanced, in a direction opposite to the travel direction of the laser beam, by the focal length F from the principal point of the wavefront adjuster (see FIG. 3B).

Figure 4A:
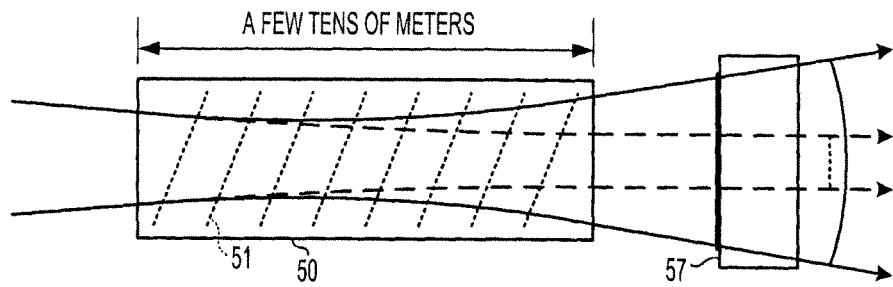
FIG. 4A is a diagram for discussing how a wavefront is adjusted by first and second wavefront adjusters.
Figure 4B:
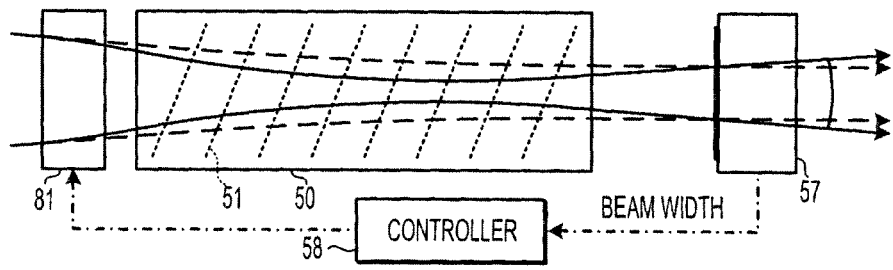
FIG. 4B is another diagram for discussing how a wavefront is adjusted by first and second wavefront adjusters.
Figure 4C:
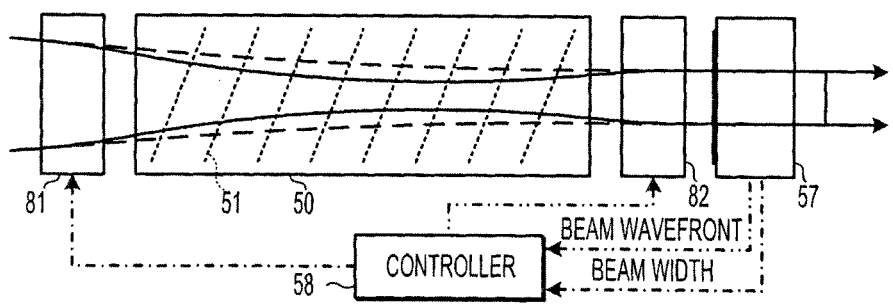
FIG. 4C is yet another diagram for discussing how a wavefront is adjusted by first and second wavefront adjusters.

FIGS. 4A through 4C are diagrams for discussing how a wavefront is adjusted by the first and second wavefront adjusters. A laser beam from the laser apparatus 3 may travel through the beam delivery unit 50 to enter the chamber 2. The length of the optical path from the input end to the output end of the beam delivery unit 50 may be as long as a few tens of meters, and the beam delivery unit 50 may include multiple high-reflection mirrors 51.

When the high-reflection mirrors 51 are heated by absorbing the energy of the laser beam and deform, distortion in the wavefront of the laser beam may accumulate along its beam path between the input end and the output end of the beam delivery unit 50. Although a laser beam may have a beam path and a wavefront shown by broken lines in FIG. 4A when a heat load is low, the laser beam may have a beam path and a wavefront shown by solid lines in FIG. 4A when a heat load is high. When the wavefront changes as shown in FIG. 4A, the beam width may change as the laser beam travels.

Thus, as shown in FIG. 4B, by controlling the first wavefront adjuster 81 based on a detection result of a beam width at the photosensitive surface of the first beam monitor 57, the beam width of a subsequent laser beam at the photosensitive surface of the first beam monitor 57 may be adjusted to a desired width.

Further, as shown in FIG. 4C, by controlling the second wavefront adjuster 82 based on a detection result of a wavefront at the photosensitive surface of the first beam monitor 57, the wavefront of a subsequent laser beam at the photosensitive surface of the first beam monitor 57 may be adjusted to a desired wavefront.

In this way, the beam width and the wavefront at the photosensitive surface of the first beam monitor 57 may be adjusted to desired width and wavefront, respectively. Accordingly, not only a distortion in the wavefront generated in the beam delivery unit 50 may be adjusted, a distortion in the wavefront generated in a beam path upstream from the beam delivery unit 50 may also be adjusted. Here, a second beam monitor (not separately shown) may be provided in a beam path between the beam delivery unit 50 and the second wavefront adjuster 82 to detect a beam width of a laser beam from the beam delivery unit 50. That is, a wavefront curvature may be calculated based on a detection result of the first beam monitor 57, and a beam width may be calculated based on a detection result of the second beam monitor.

3.3 Operation
3.3.1 Main Flow

Figure 5:
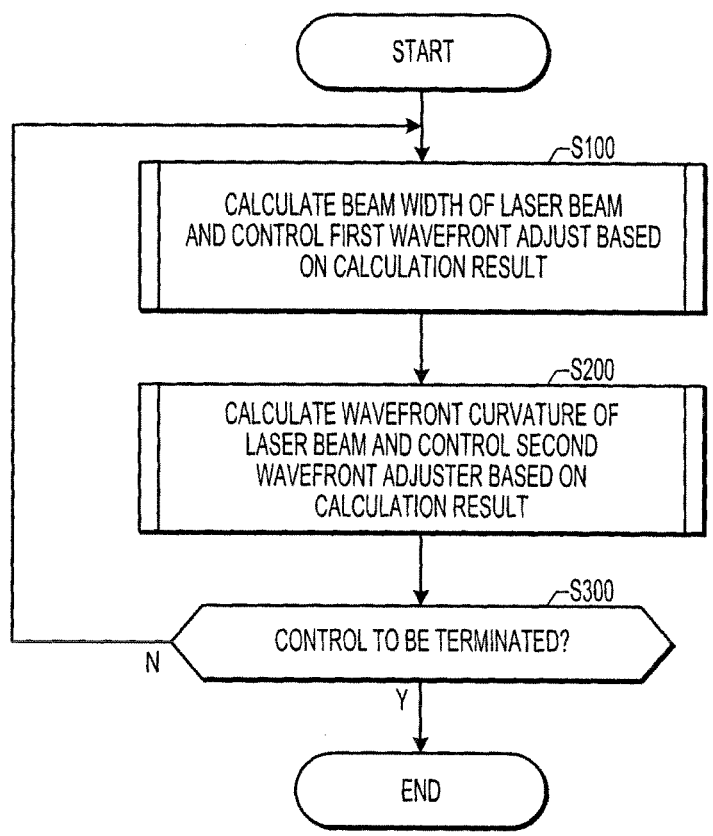
FIG. 5 is a flowchart showing an exemplary operation of a controller in the first embodiment.

FIG. 5 is a flowchart showing an exemplary operation of the controller in the first embodiment. The controller 58 may control the first wavefront adjuster 81 and the second wavefront adjuster 82 as described below so that a sample beam of a laser beam having a desired beam width and a desired wavefront is incident on the photosensitive surface of the first beam monitor 57.

The controller 58 may first calculate a beam width of a laser beam from a detection result of the first beam monitor 57, and control the first wavefront adjuster 81 based on a calculation result (Step S100). The controller 58 may then calculate a wavefront curvature of a laser beam from a detection result of the first beam monitor 57, and control the second wavefront adjuster 82 based on a calculation result (Step S200).

Thereafter, the controller 58 may receive a signal from the EUV light generation controller 5 to determine whether or not the control in this flowchart is to be terminated (Step S300). When a signal indicating termination of the control is received from the EUV light generation controller 5 (Step S300; YES), the control may be terminated. When a signal indicating termination of the control is not received (Step S300; NO), the controller 58 may return to Step S100 and repeat the subsequent steps.

3.3.2 Control of First Wavefront Adjuster (Details of S100)

Figure 6A:
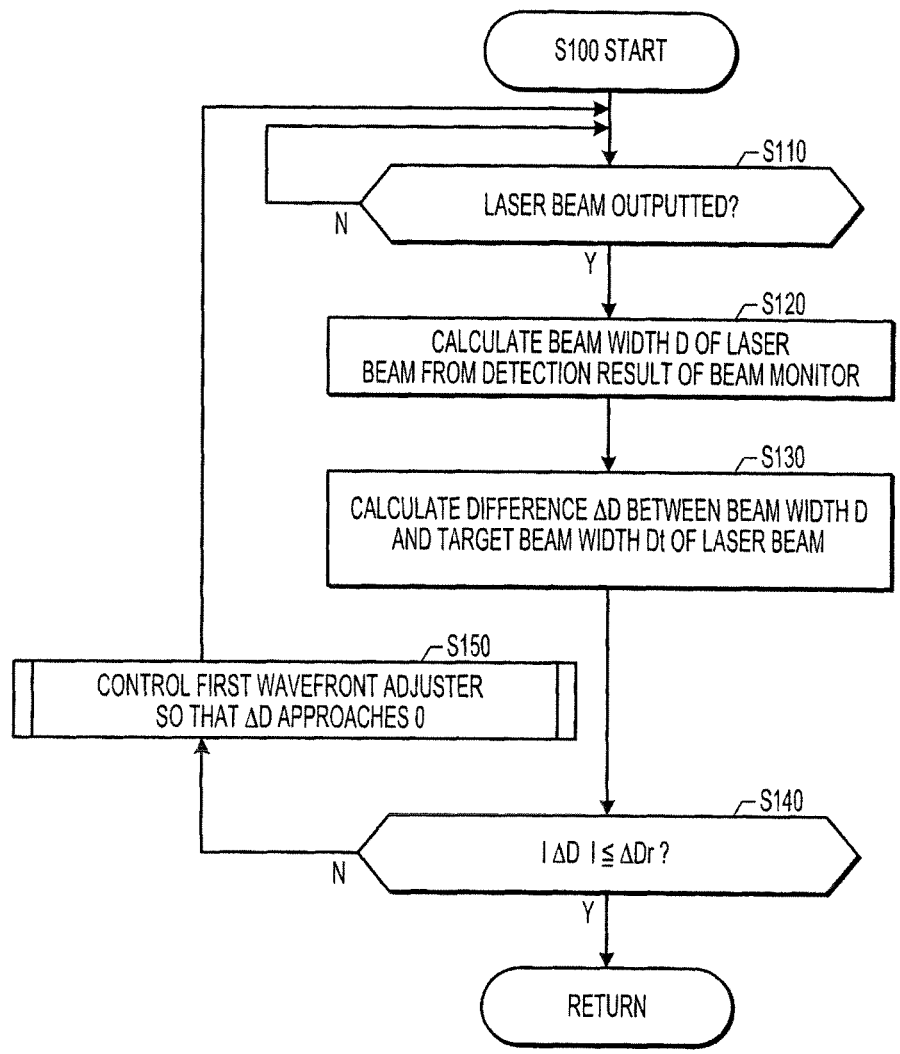
FIG. 6A is a flowchart showing a process for controlling the first wavefront adjuster indicated in FIG. 5.

FIG. 6A is a flowchart showing a process for controlling the first wavefront adjuster indicated in FIG. 5. The process shown in FIG. 6A may be carried out by the controller 58 as a subroutine in Step S100 of FIG. 5.

The controller 58 may first receive a signal from the EUV light generation controller 5 and determine whether or not a laser beam has been outputted from the laser apparatus 3 (Step S110). When a laser beam has not been outputted (Step S110; NO), the controller 58 may stand by until a laser beam is outputted from the laser apparatus 3. When a laser beam has been outputted (Step S110; YES), the controller 58 may proceed to Step S120.

In Step S120, the controller 58 may calculate a beam width D of a laser beam from a detection result received from the first beam monitor 57. Then, the controller 58 may calculate a difference $\Delta D$ between the beam width D and a target beam width Dt through the following expression (Step S130).

$$\Delta D = D - Dt$$

Then, the controller 58 may determine whether or not an absolute value of the difference $\Delta D$ is equal to or smaller than a desired threshold $\Delta Dr$ (Step S140). When the absolute value of the difference $\Delta D$ is greater than the threshold $\Delta Dr$ (Step S140; NO), the controller 58 may proceed to Step S150 to control the first wavefront adjuster 81 so that a subsequent instance of the difference $\Delta D$ approaches 0. When the absolute value of the difference $\Delta D$ is equal to or smaller than the threshold $\Delta Dr$ (Step S140; YES), the operation in this flowchart may be terminated.

Figure 6B:
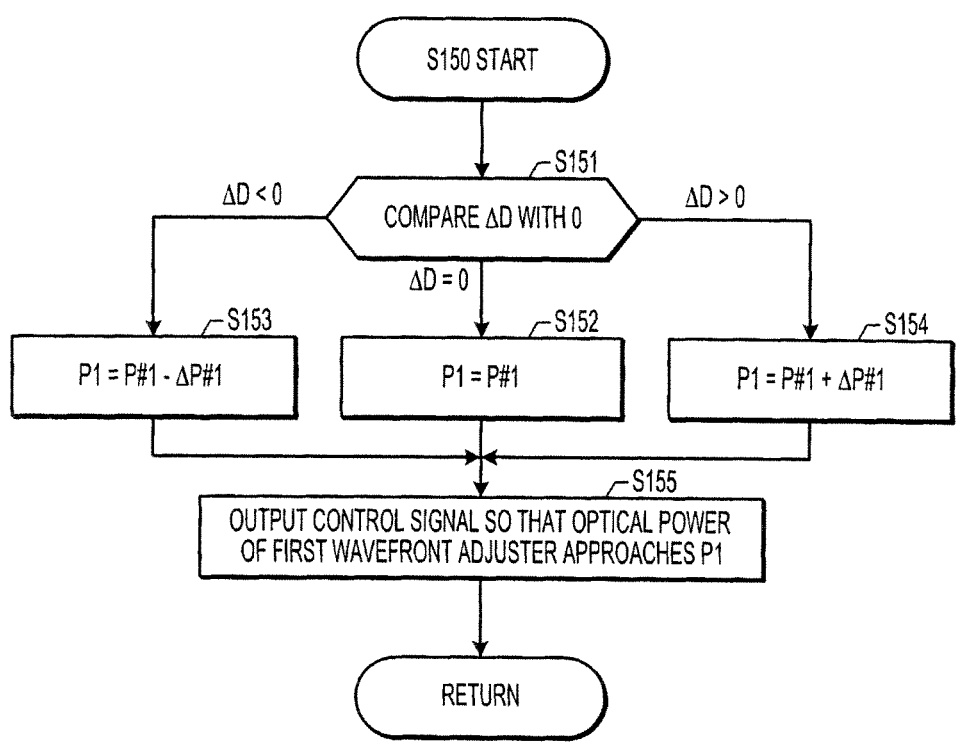
FIG. 6B is a flowchart showing details of the process for controlling the first wavefront adjuster indicated in FIG. 6A.

FIG. 6B is a flowchart showing details of the process for controlling the first wavefront adjuster indicated in FIG. 6A. The process shown in FIG. 6B may be carried out by the controller 58 as a subroutine in Step S150 of FIG. 6A.

The controller 58 may first compare the current instance of the difference $\Delta D$ with 0 (Step S151). In Step S151, when the current instance of the difference $\Delta D$ is equal to 0 ($\Delta D=0$), the controller 58 may proceed to Step S152. In Step S152, a current instance of an optical power P#1 set in the first wavefront adjuster 81 may be set as a target optical power P1.

In Step S151, when the current instance of the difference $\Delta D$ is smaller than 0 ($\Delta D<0$), the controller 58 may proceed to Step S153. In Step S153, a value obtained by subtracting a predetermined constant $\Delta P\#1$ from a current instance of an optical power P#1 set in the first wavefront adjuster 81 may be set as a target optical power P1.

In Step S151, when the current instance of the difference $\Delta D$ is greater than 0 ($\Delta D>0$), the controller 58 may proceed to Step S154. In Step S154, a value obtained by adding a predetermined constant $\Delta P\#1$ to a current instance of an optical power P#1 set in the first wavefront adjuster 81 may be set as a target optical power P1. The predetermined constant $\Delta P\#1$ may be a positive value.

Thereafter, the controller 58 may output a control signal to the first wavefront adjuster 81 so that an optical power set in the first wavefront adjuster 81 approaches the target optical power P1 (Step S155), and terminate the operation in this flowchart.

3.3.3 Control of Second Wavefront Adjuster (Details of S200)

Figure 7A:
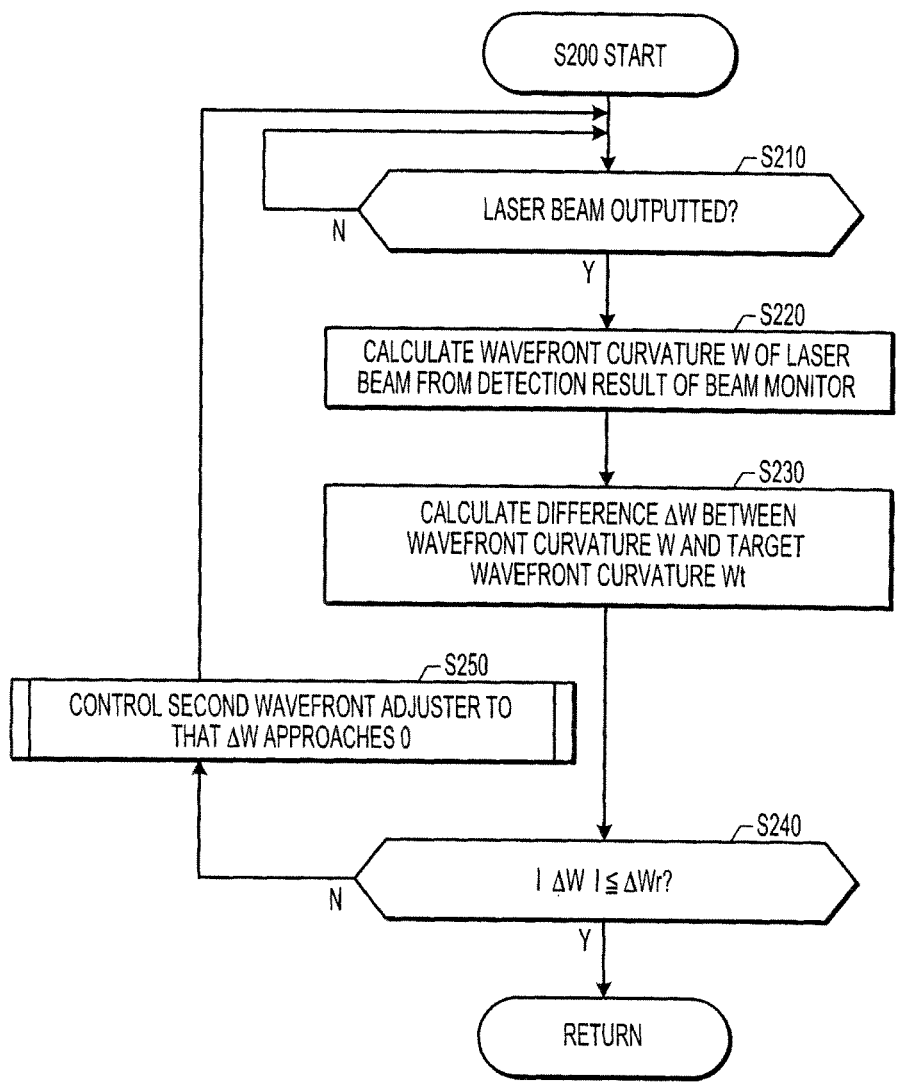
FIG. 7A is a flowchart showing a process for controlling the second wavefront adjuster indicated in FIG. 5.

FIG. 7A is a flowchart showing a process for controlling the second wavefront adjuster indicated in FIG. 5. The process shown in FIG. 7A may be carried out by the controller 58 as a subroutine in Step S200 of FIG. 5.

The controller 58 may first receive a signal from the EUV light generation controller 5 and determine whether or not a laser beam has been outputted from the laser apparatus 3 (Step S210). When a laser beam has not been outputted (Step S210; NO), the controller 58 may stand by until a laser beam is outputted from the laser apparatus 3. When a laser beam has been outputted (Step S210; YES), the controller 58 may proceed to Step S220.

In Step S220, the controller 58 may calculate a wavefront curvature W of a laser beam from a detection result of the first beam monitor 57. Then, the controller 58 may calculate a difference $\Delta W$ between the wavefront curvature W and a target wavefront curvature Wt of a laser beam through the following expression (Step S230).

$$\Delta W = W - Wt$$

Then, the controller 58 may determine whether or not an absolute value of the difference ΔW is equal to or smaller than a predetermined threshold ΔWr (Step S240). When the absolute value of the difference ΔW is greater than the threshold ΔWr (Step S240; NO), the controller 58 may proceed to Step S250 to control the second wavefront adjuster 82 so that a subsequent instance of the difference ΔW approaches 0. When the absolute value of the difference ΔW is equal to or smaller than the threshold ΔWr, the operation in this flowchart may be terminated.

Figure 7B:
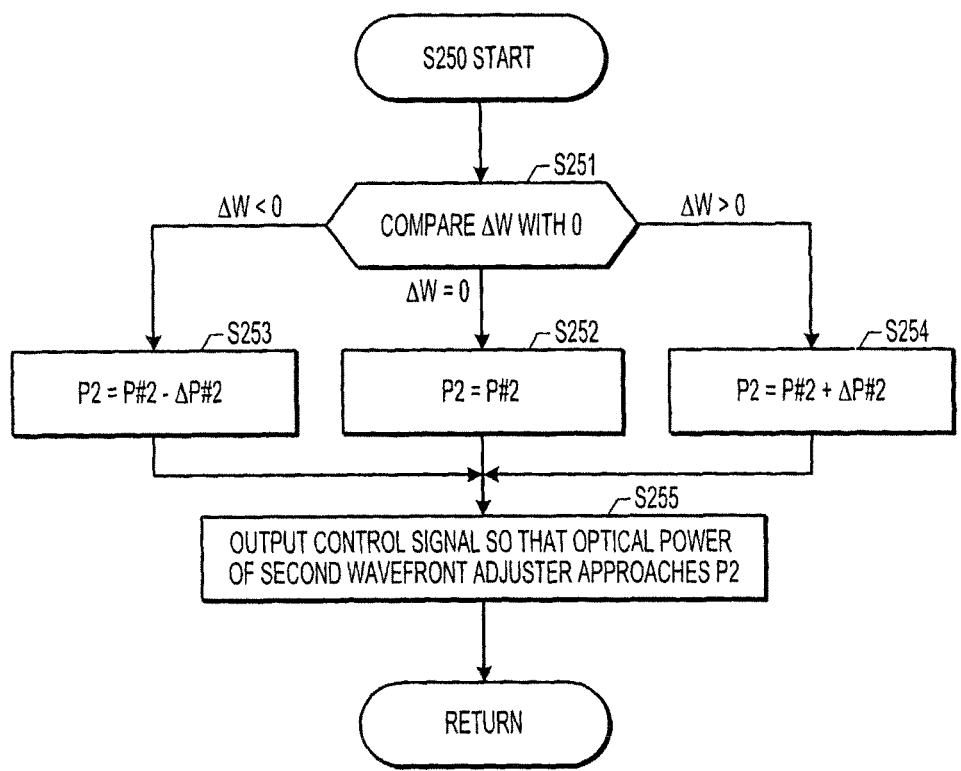
FIG. 7B is a flowchart showing details of the process for controlling the second wavefront adjuster indicated in FIG. 7A.

FIG. 7B is a flowchart showing details of the process for controlling the second wavefront adjuster indicated in FIG. 7A. The process shown in FIG. 7B may be carried out by the controller 58 as a subroutine in Step S250 of FIG. 7A.

The controller 58 may first compare the current instance of the difference ΔW with 0 (Step S251). In Step S251, when the current instance of the difference ΔW is equal to 0 (ΔW=0), the controller 58 may proceed to Step S252. In Step S252, a current instance of an optical power P#2 set in the second wavefront adjuster 82 may be set as a target optical power P2.

In Step S251, when the current instance of the difference ΔW is smaller than 0 (ΔW<0), the controller 58 may proceed to Step S253. In Step S253, a value obtained by subtracting a predetermined constant ΔP#2 from a current instance of an optical power P#2 set in the second wavefront adjuster 82 may be set as a target optical power P2.

In Step S251, when the current instance of the differenced ΔW is greater than 0 (ΔW>0), the controller 58 may proceed to Step S254. In Step S254, a value obtained by adding a predetermined constant ΔP#2 to a current instance of an optical power P#2 set in the second wavefront adjuster 82 may be set as a target optical power P2. The predetermined constant ΔP#2 may be a positive value.

Then, the controller 58 may output a control signal to the second wavefront adjuster 82 so that an optical power of the second wavefront adjuster 82 approaches the target optical power P2 (Step S255), and terminate the operation in this flowchart.

Figure 8A:
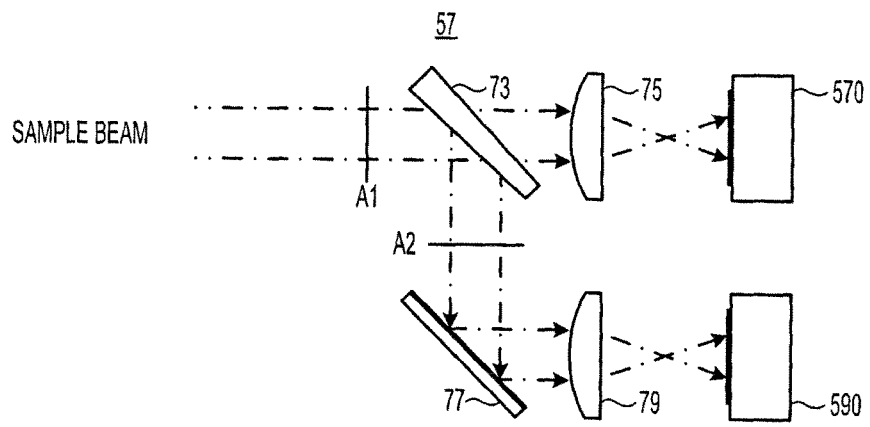
FIG. 8A schematically illustrates a first example of a beam monitor in the EUV light generation system according to the first embodiment.
Figure 8B:
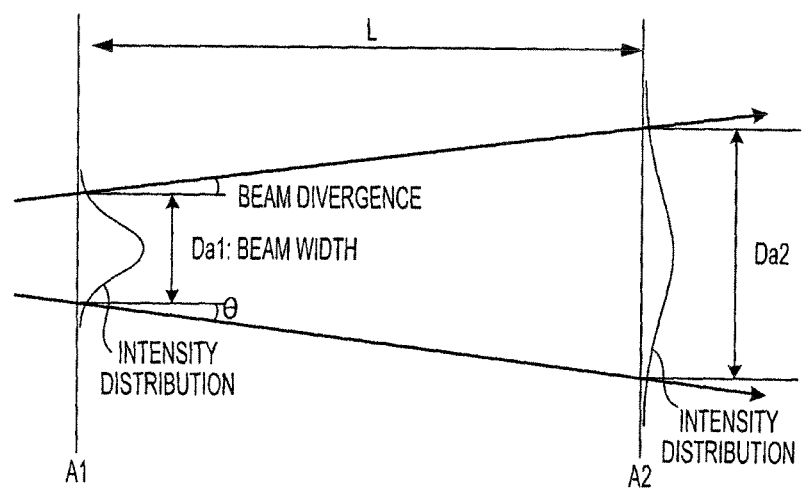
FIG. 8B is a diagram for discussing how a beam profile is detected when the first example of the beam monitor is adopted.

3.4 Examples of Beam Monitor
3.4.1 Detecting Beam Width at Two Difference Positions FIG. 8A schematically illustrates a first example of a beam monitor in the EUV light generation system according to the first embodiment. FIG. 8B is a diagram for discussing how a beam width is obtained when the first example of the beam monitor is adopted. In the first example, a sample beam may first be split by a beam splitter 73. Then, a part of the sample beam transmitted through the beam splitter 73 and the remaining part of the sample beam reflected by the beam splitter 73 may be detected separately at two distinct positions so that the two parts of the sample beam have respectively differing optical path lengths. In this way, beam profiles at two distinct positions along the travel direction of the sample beam may be obtained.

As shown in FIG. 8A, the first beam monitor 57 may include the beam splitter 73, a high-reflection mirror 77, transfer optical systems 75 and 79, and beam profilers 570 and 590. Each of the beam profilers 570 and 590 may, for example, be a line sensor or a charge coupled device (CCD) camera.

The beam splitter 73 may be configured and positioned to transmit a part of the sample beam toward the transfer optical system 75 and reflect the remaining part of the sample beam toward the high-reflection mirror 77. The high-reflection mirror 77 may be positioned to reflect the sample beam from the beam splitter 73 toward the transfer optical system 79 with high reflectance.

The transfer optical system 75 may transfer onto the photosensitive surface of the beam profiler 570 a beam profile of the sample beam at a given position A1 along a beam path thereof between the beam splitter 56 (see FIG. 2) and the beam splitter 73. The transfer optical system 79 may transfer onto the photosensitive surface of the beam profiler 590 a beam profile of the sample beam at another given position A2 along a beam path thereof. An optical path length from the position A1 to the photosensitive surface may be equal to an optical path length from the position A2 to the photosensitive surface of the beam profiler 590. Each of the beam profilers 570 and 590 may output data on an obtained beam profile to the controller 58.

The controller 58 may calculate a beam width Da1 of the sample beam at the position A1 from the data received from the beam profiler 570. The term "beam width" herein may refer to a width of a region in a beam profile which has beam intensity equal to or greater than $1/e^2$ of the peak intensity in a beam intensity distribution.

Further, the controller 58 may calculate a wavefront curvature of the sample beam from the data received from the beam profilers 570 and 590. For example, the controller 58 may calculate a beam width Da2 of the sample beam at the position A2 from the data from the beam profiler 590, and calculate a wavefront curvature of the sample beam from a difference between the beam width Da1 and the beam width Da2 of the sample beam. In order to calculate a wavefront curvature of the sample beam, a divergence θ may be calculated through the following expression.

$$\theta = \tan^{-1}\{(Da2-Da1)/2L\}$$

Here, L is a distance between the position A1 and the position A2 along the beam path of the sample beam.

Based on the above-described calculation results, the controller 58 may control the first wavefront adjuster 81 and the second wavefront adjuster 82. The controller 58 in this example may carry out the same operation as those shown in the flowcharts of FIGS. 5, 6A, 6B, 7A, and 7B. In that case, the beam width D in FIG. 6A may be replaced by the beam width Da1, and the wavefront curvature W and the target wavefront curvature Wt in FIG. 7A may be replaced respectively by a beam divergence θ and a target beam divergence θt.

3.4.2 Detecting Beam Width and Beam Spot Width

Figure 9:
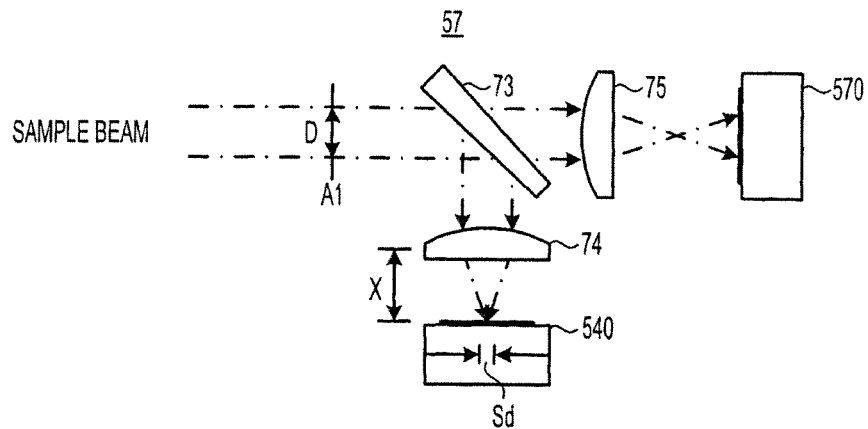
FIG. 9 schematically illustrates a second example of a beam monitor in the EUV light generation system according to the first embodiment.

FIG. 9 schematically illustrates a second example of a beam monitor in the EUV light generation system according to the first embodiment. In the second example, a sample beam may first be split by the beam splitter 73, and a beam profile and a beam spot width of the sample beam may be detected.

As shown in FIG. 9, the first beam monitor 57 may include the beam splitter 73, a focusing optical system 74, the transfer optical system 75, and beam profilers 540 and 570. The beam splitter 73 may be configured and positioned to transmit a part of a sample beam toward the transfer optical system 75 and reflect the remaining part thereof toward the focusing optical system 74.

The transfer optical system 75 may be positioned to transfer onto the photosensitive surface of the beam profiler 570 a beam profile of a sample beam at a position A1 along a beam path of the sample beam. The focusing optical system 74 may be positioned to focus the sample beam from the beam splitter 73 onto the photosensitive surface of the beam profiler 540. The beam profiler 540 may be provided at a position distanced by a predetermined distance X from the focusing optical system 74.

The predetermined distance X may be determined based on a wavefront curvature of a sample beam entering the focusing optical system 74. When a sample beam having a planar wavefront enters the focusing optical system 74, the predetermined distance X may be equal to the focal length of the focusing optical system 74. When a sample beam having a convex wavefront enters the focusing optical system 74, the predetermined distance X may be longer than the focal length of the focusing optical system 74. When a laser beam having a concave wavefront enters the focusing optical system 74, the predetermined distance X may be shorter than the focal length of the focusing optical system 74. The beam profilers 540 and 570 may output data on beam profiles respectively imaged and transferred onto the respective photosensitive surfaces to the controller 58.

The controller 58 may calculate a beam width D of the sample beam at the position A1 from the data received from the beam profiler 570. Further, the controller 58 may calculate a wavefront curvature of the sample beam from the data received from the beam profiler 540. In order to calculate the wavefront curvature, a beam spot width Sd of the sample beam may be calculated.

Based on the above-described calculation results, the controller 58 may control the first wavefront adjuster 81 and the second wavefront adjuster 82. The controller 58 may carry out the same operation as those shown in the flowcharts of FIGS. 5, 6A, 6B. Here, in order to control the second wavefront adjuster 82, in place of the operations shown in FIGS. 7A and 7B, the following operations may be carried out.

Figure 10A:
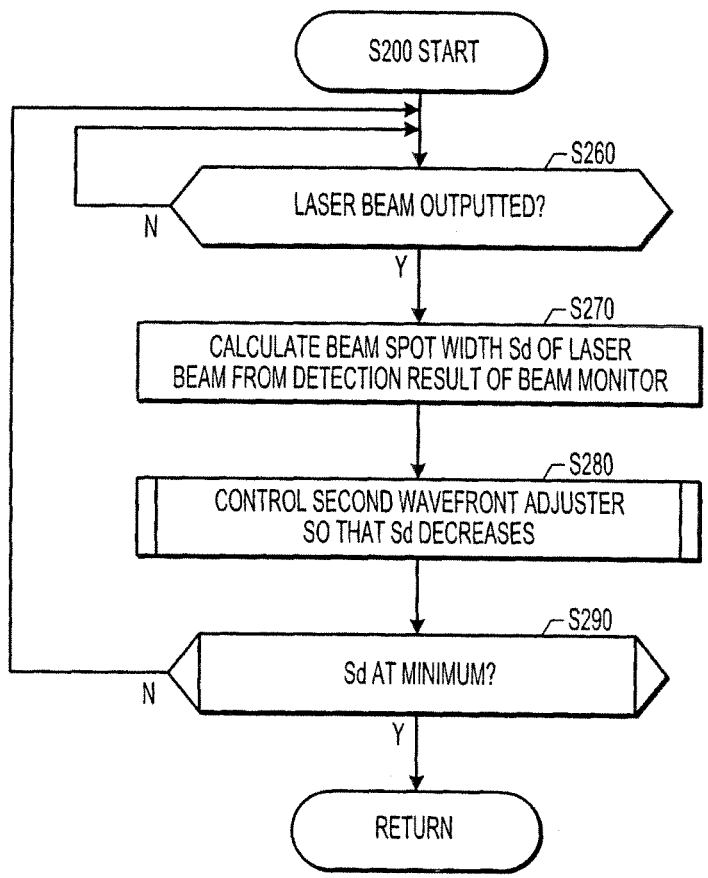
FIG. 10A is a flowchart showing a process for controlling the second wavefront adjuster when the second example of the beam monitor is adopted.

FIG. 10A is a flowchart showing a process for controlling the second wavefront adjuster when the second example of the beam monitor is adopted. The process shown in FIG. 10A may be carried out by the controller 58 as a subroutine in Step S200 of FIG. 5.

The controller 58 may first receive a signal from the EUV light generation controller 5 and determine whether or not a laser beam has been outputted from the laser apparatus 3 (Step S260). When a laser beam has not been outputted (Step S260; NO), the controller 58 may stand by until a laser beam is outputted. When a laser beam has been outputted (Step S260; YES), the controller 58 may proceed to Step S270.

In Step S270, the controller 58 may calculate a beam spot width Sd of the sample beam from the data received from the beam profiler 540. Then, the controller 58 may control the second wavefront adjuster 82 so that a subsequent instance of the beam spot width Sd becomes smaller than the current instance thereof (Step S280). Subsequently, the controller 58 may determine whether or not the beam spot width Sd is at the minimum (Step S290). Here, the beam spot width Sd being at the minimum may mean that the beam spot width Sd is captured within a depth of focus thereof. Specific methods for this determination will be described later. When the beam spot width Sd is not at the minimum (Step S290; NO), the controller 58 may return to Step S260 and repeat the subsequent steps. On the other hand, when the beam spot width Sd is at the minimum (Step S290; YES), the operation in this flowchart may be terminated.

Figure 10B:
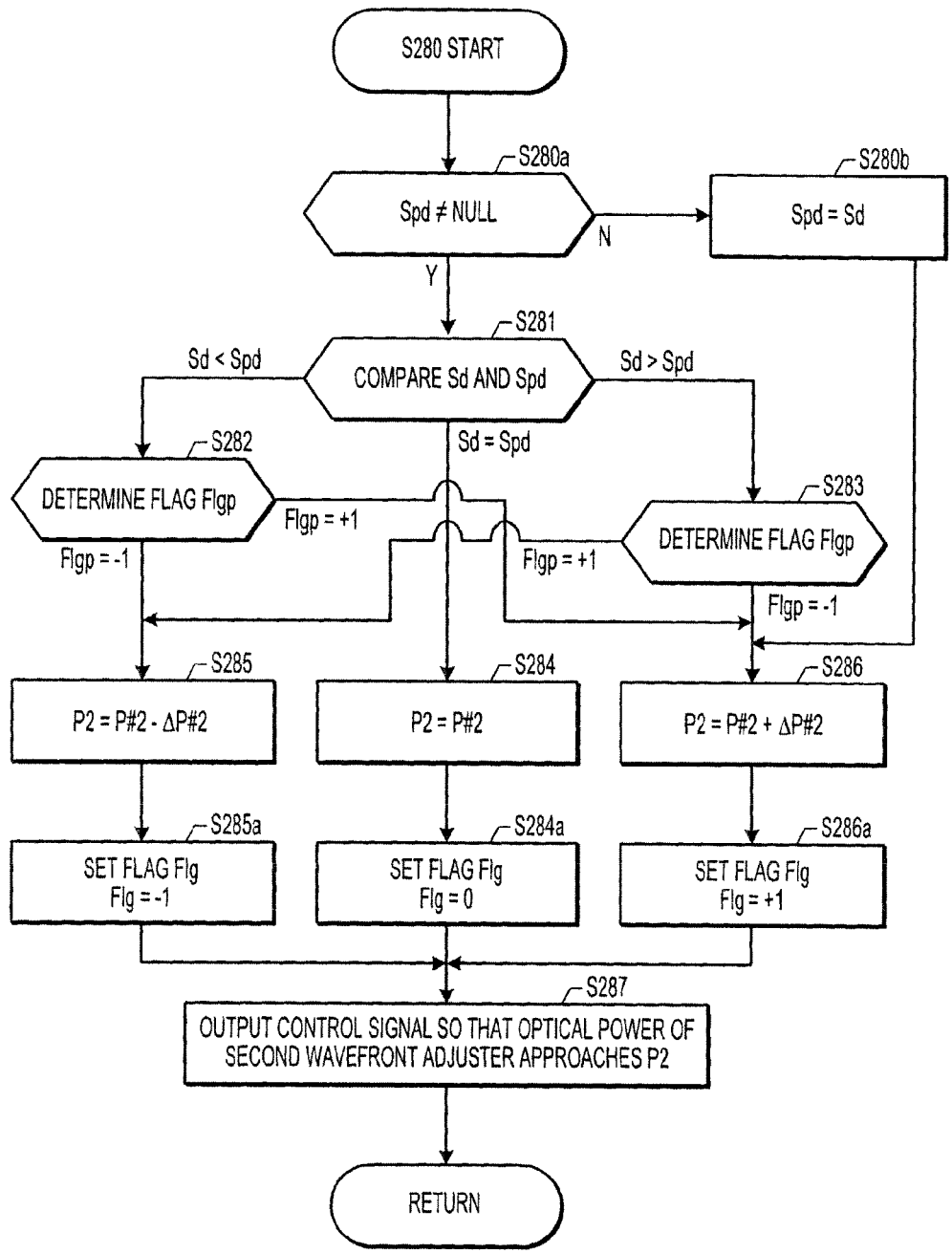
FIG. 10B is a flowchart showing details of the process for controlling the second wavefront adjuster indicated in FIG. 10A.
Figure 10C:
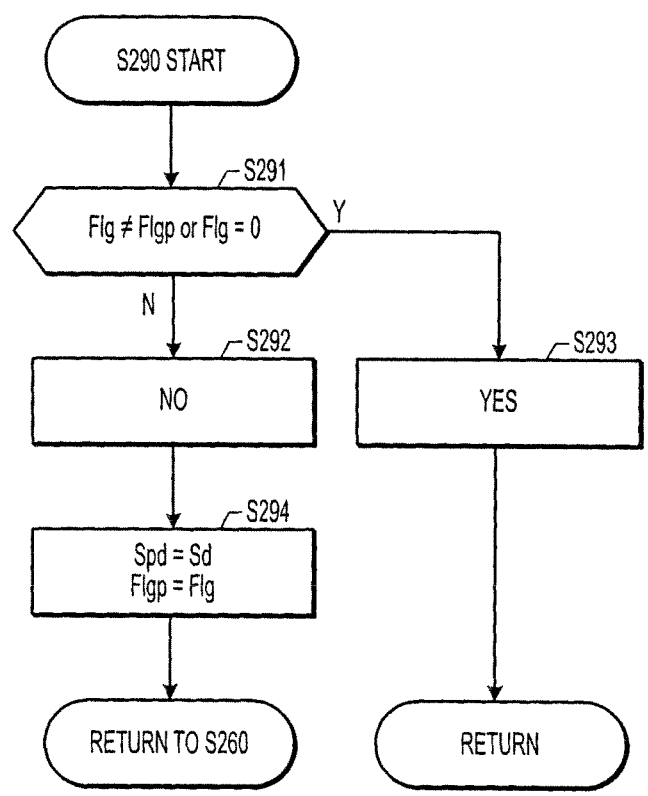
FIG. 10C is another flowchart showing details of the process for controlling the second wavefront adjuster indicated in FIG. 10A.

FIGS. 10B and 10C are flowcharts showing details of the process for controlling the second wavefront adjuster indicated in FIG. 10A. The process shown in FIG. 10B may be carried out by the controller 58 as a subroutine in Step S280 of FIG. 10A. The process shown in FIG. 10C may be carried out by the controller 58 as a subroutine in Step S290 of FIG. 10A.

As shown in FIG. 10B, the controller 58 may first determine whether or not data is present in a previous instance of a beam spot width Spd (Step S280a). When the beam spot width Spd is null (Step S280a; NO), the current instance of the beam spot width Sd may be set in the beam spot width Spd (Step S280b), and the controller 58 may proceed to Step S286. The operation thereafter will be described later. Alternatively, the controller 58 may proceed from Step S280b to Step S285 instead of Step S286. In Step S280a, when the beam spot width Spd is not null (Step S280a; YES), the controller 58 may proceed to Step S281.

In Step S281, the controller 58 may compare the current instance of the beam spot width Sd with the previous instance of the beam spot width Spd. When the current instance of the beam spot width Sd is smaller than the previous instance of the beam spot width Spd (Sd<Spd), the controller 58 may determine a value set in a flag Flgp (Step S282). Here, a value may have been set in the flag Flgp as follows. When the optical power of the second wavefront adjuster 82 has been increased in a previous instance, a first value, such as +1, may have been set. When the optical power of the second wavefront adjuster 82 has been decreased in a previous instance, a second value, such as −1, may have been set.

In Step S282, when the first value is set in the flag Flgp (Flgp=+1), the optical power of the second wavefront adjuster 82 may further be increased. That is, a value obtained by adding a predetermined constant ΔP#2 to a current instance of an optical power P#2 set in the second wavefront adjuster 82 may be set as a target optical power P2 (Step S286). The predetermined constant ΔP#2 may be a positive value.

On the other hand, when the second value is set in the flag Flgp (Flgp=−1) in Step S282, the optical power of the second wavefront adjuster 82 may further be decreased. That is, a value obtained by subtracting a predetermined constant ΔP#2 from the current instance of an optical power P#2 set in the second wavefront adjuster 82 may be set as a target optical power P2 (Step S285).

In Step S281, when the current instance of the beam spot width Sd is greater than the previous instance of the beam spot width Spd (Sd>Spd), the controller 58 may determine a value set in a flag Flgp (Step S283).

In Step S283, when the first value is set in the flag Flgp (Flgp=+1), the controller 58 may proceed to Step S285, which has been described above.

On the other hand, when the second value is set in the flag Flgp (Flgp=−1) in Step S283, the controller 58 may proceed to Step S286, which has been described above.

After the target optical power of the second wavefront adjuster 82 is increased in Step S286, the first value may be set in a current instance of a flag Flg (Step S286a), and the controller 58 may proceed to Step S287.

After the target optical power of the second wavefront adjuster 82 is decreased in Step S285, the second value may be set in a current instance of a flag Flg (Step S285a), and the controller 58 may proceed to Step S287.

In Step S281, when the current instance of the beam spot width Sd is equal to the previous instance of the beam spot width Spd (Sd=Spd), the controller 58 may set the current instance of the optical power P#2 set in the second wavefront adjuster 82 as a target optical power P2 (Step S284). Then, the controller 58 may set a third value, such as 0, in the flag Flg (Step S284a), and proceed to Step S287.

In Step S287, the controller 58 may output a control signal to the second wavefront adjuster 82 so that the optical power of the second wavefront adjuster 82 is set to the target optical power P2, and terminate the operation shown in FIG. 10B.

With reference to FIG. 10C, the controller 58 may determine whether or not a value set in the flag Flg differs from a value set in the flag Flgp (Step S291). In Step S291, when a value set in the flag Flg is equal to a value set in the flag Flgp, or a value set in the flag Flg is not 0 (Step S291; NO), the controller 58 may determine that the beam spot width Sd has not reached the minimum (Step S292), and proceed to Step S294.

In Step S291, when a value set in the flag Flg is different from a value set in the flag Flgp, or the a value set in the flag Flg is 0 (Step S291; YES), the controller 58 may determine that the beam spot width Sd has reached the minimum (Step S293), and terminate the operation in this flowchart.

In Step S294, the controller 58 may overwrite the previous instance of the beam spot width Spd with the current instance of the beam spot width Sd, and overwrite the flag Flgp with the flag Flg. Thereafter, the controller 58 may return to Step S260 and repeat the subsequent steps.

3.4.3 Using Shack-Hartmann Wavefront Sensor

Figure 11A:
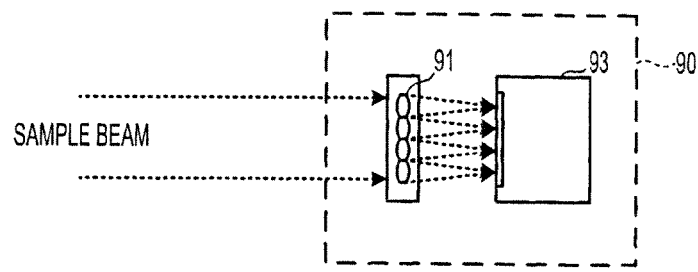
FIG. 11A schematically illustrates a third example of a beam monitor in the EUV light generation system according to the first embodiment.
Figure 11B:
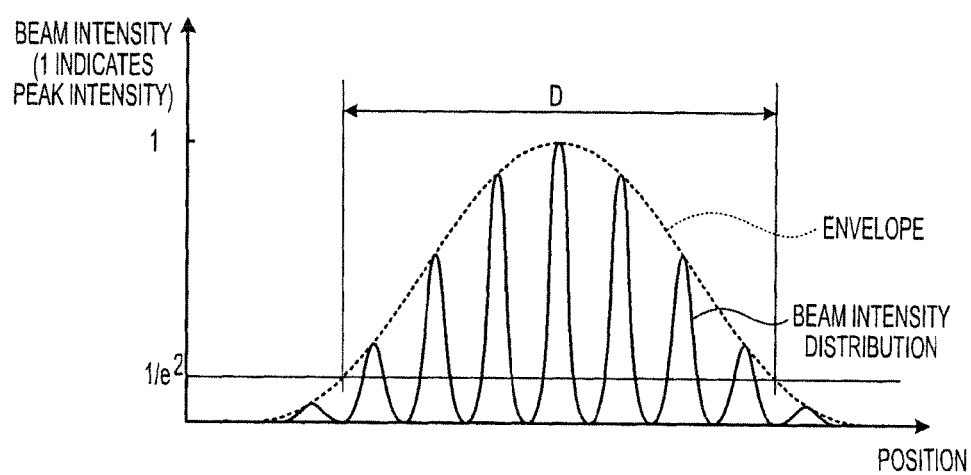
FIG. 11B is a diagram for discussing how a beam profile is detected when the third example of the beam monitor is adopted.

FIG. 11A schematically illustrates a third example of a beam monitor in the EUV light generation system according to the first embodiment. FIG. 11B is a diagram for discussing how a sample beam is detected when the third example of the beam monitor is adopted. In the third example, a Shack-Hartmann wavefront sensor may be used to obtain a beam width and a wavefront curvature of a sample beam.

As shown in FIG. 11A, a Shack-Hartmann wavefront sensor 90 serving as a beam monitor may include a microlens array 91 and a CCD camera 93.

The microlens array 91 may be an optical element in which a plurality of fine convex and concave lenses are arranged two-dimensionally. The CCD camera 93 may be provided to capture an image of a laser beam focused by the microlens array 91.

The controller 58 may calculate a beam width and a wavefront curvature of the sample beam from an output of the CCD camera 93. The shape of the focus image, such as intervals of peaks in the beam intensity, generated through the microlens array 91 may depend on a wavelength and a wavefront curvature of a laser beam. Accordingly, when the wavelength of the sample beam is known, the wavefront curvature of the sample beam may be calculated from the shape of the focus image.

Further, by detecting an envelope of the beam intensity distribution in the focus image generated through the microlens array 91 as shown in FIG. 11B, an approximation curve of the beam intensity distribution along a beam profile of the sample beam may be obtained. Then, the beam width D of the sample beam may be calculated from the aforementioned envelope.

Based on the above-described calculation results, the controller 58 may control the first wavefront adjuster 81 and the second wavefront adjuster 82. The controller 58 may carry out the same operation as those shown in the flowcharts of FIGS. 5, 6A, 6B, 7A, and 7B.

Figure 12:
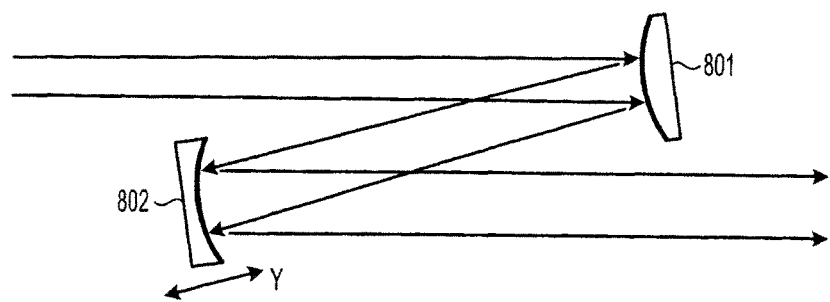
FIG. 12 schematically illustrates a first example of a wavefront adjuster in the EUV light generation system according to the first embodiment.

3.5 Examples of Wavefront Adjuster 3.5.1 Combination of Convex Mirror and Concave Mirror FIG. 12 schematically illustrates a first example of a wavefront adjuster in the EUV light generation system according to the first embodiment. In the first example, the wavefront adjuster may include a convex mirror 801, a concave mirror 802, and a driving mechanism (not separately shown). The reflective surface of each of the convex mirror 801 and the concave mirror 802 may be spherical in shape. The beam intensity of a laser beam in this example may be substantially in the Gaussian distribution. The first example of the wavefront adjuster described here may be adopted as either the first or second wavefront adjuster 81 or 82.

The convex mirror 801 of the first wavefront adjuster 81 in the first example may be held by a mirror holder (not separately shown) to be positioned such that a laser beam outputted from the laser apparatus 3 (see FIG. 2) is incident thereon. The laser beam from the laser apparatus 3 may be reflected by the convex mirror 801 toward the concave mirror 802. The concave mirror 802 may be supported by a mirror holder (not separately shown) and the aforementioned driving mechanism (not separately shown) such that the concave mirror 802 is movable along a beam path of the laser beam reflected by the convex mirror 801. The concave mirror 802 may be oriented to reflect the laser beam from the convex mirror 801 toward the beam delivery unit 50 (see FIG. 2). The convex mirror 801 of the second wavefront adjuster 82 may be held by a mirror holder (not separately shown) to be positioned such that a laser beam from the beam delivery unit 50 is incident thereon. The function of the convex mirror 801 and the arrangement and the function of the concave mirror 802 of the second wavefront adjuster 82 may be substantially the same as those in the above-described first wavefront adjuster 81.

The aforementioned driving mechanism may move the concave mirror 802 in the direction indicated by the arrow Y along the beam path of the laser beam reflected by the convex mirror 801, to thereby adjust the distance between the convex mirror 801 and the concave mirror 802. By adjusting the distance between the convex mirror 801 and the concave mirror 802, the wavefront of the laser beam reflected by the concave mirror 802 may be adjusted.

3.5.2 Combination of Concave Mirror and Convex Mirror

Figure 13:
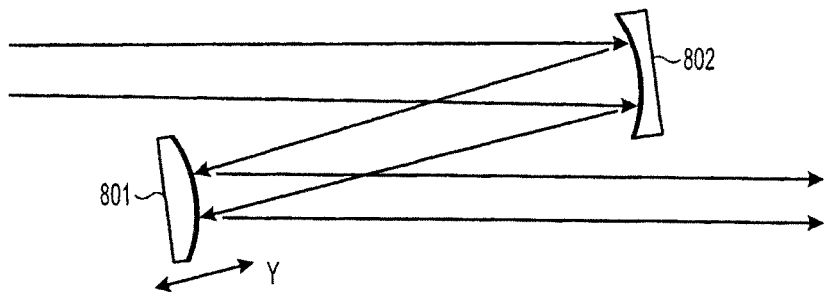
FIG. 13 schematically illustrates a second example of a wavefront adjuster in the EUV light generation system according to the first embodiment.

FIG. 13 schematically illustrates a second example of a wavefront adjuster in the EUV light generation system according to the first embodiment. In the second example, the wavefront adjuster may include the concave mirror 802, the convex mirror 801, and a driving mechanism (not separately shown).

The concave mirror 802 of the first wavefront adjuster 81 of the second example may be held by a mirror holder (not separately shown) to be positioned such that a laser beam outputted from the laser apparatus 3 (see FIG. 2) is incident thereon. The laser beam from the laser apparatus 3 may be reflected by the concave mirror 802 toward the convex mirror 801. The convex mirror 801 may be supported by a mirror holder (not separately shown) and the aforementioned driving mechanism (not separately shown) such that the convex mirror 801 is movable along a beam path of the laser beam reflected by the concave mirror 802. The convex mirror 801 may be oriented to reflect the laser beam from the convex mirror 802 toward the beam delivery unit 50 (see FIG. 2). The concave mirror 802 of the second wavefront adjuster 82 may be held by a mirror holder (not separately shown) to be positioned such that a laser beam from the beam delivery unit 50 is incident thereon. The function of the concave mirror 802 and the arrangement and the function of the convex mirror 801 of the second wavefront adjuster 82 may be substantially the same as those in the above-described first wavefront adjuster 81.

The aforementioned driving mechanism may move the convex mirror 801 in the direction indicated by the arrow Y along the beam path of the laser beam reflected by the concave mirror 802, to thereby adjust the distance between the concave mirror 802 and the convex mirror 801. By adjusting the distance between the concave mirror 802 and the convex mirror 801, the wavefront of the laser beam reflected by the convex mirror 801 may be adjusted.

3.5.3 Combination of Two Off-Axis Paraboloidal Concave Mirrors

Figure 14A:
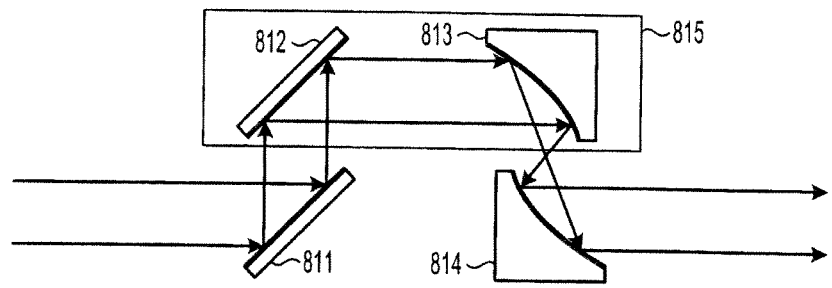
FIG. 14A schematically illustrates a third example of a wavefront adjuster in the EUV light generation system according to the first embodiment.
Figure 14B:
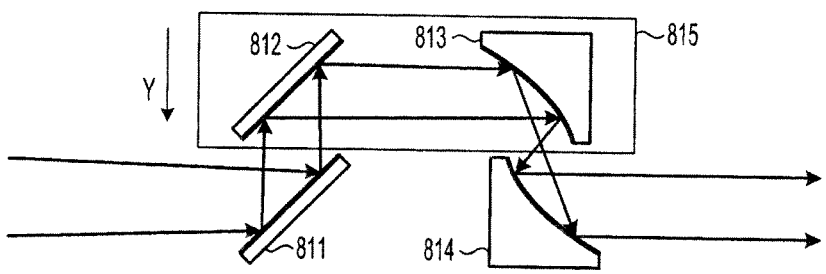
FIG. 14B further schematically illustrates the third example of the wavefront adjuster in the EUV light generation system according to the first embodiment.

FIGS. 14A and 14B schematically illustrate a third example of a wavefront adjuster in the EUV light generation system according to the first embodiment. In the third example, the wavefront adjuster may include two flat mirrors 811 and 812, two off-axis paraboloidal mirrors 813 and 814, a mirror fixing plate 815, and a driving mechanism (not separately shown).

The flat mirror 811 of the first wavefront adjuster 81 of third example may be held by a mirror holder (not separately shown) to be positioned such that a laser beam outputted from the laser apparatus 3 (see FIG. 2) is incident thereon. The laser beam from the laser apparatus 3 may be reflected by the flat mirror 811 toward the flat mirror 812.

The flat mirror 812 may be fixed to the mirror fixing plate 815 through a mirror holder (not separately shown). The flat mirror 812 may be oriented to reflect the laser beam from the flat mirror 811 toward the off-axis paraboloidal concave mirror 813.

The off-axis paraboloidal concave mirror 813 may be fixed to the mirror fixing plate 815 through another mirror holder (not separately shown). The off-axis paraboloidal concave mirror 813 may be oriented to reflect the laser beam from the flat mirror 812 toward the off-axis paraboloidal concave mirror 814. The laser beam may once be focused between the off-axis paraboloidal concave mirror 813 and the off-axis paraboloidal concave mirror 814.

The off-axis paraboloidal concave mirror 814 may be held by a mirror holder (not separately shown) to be positioned such that a laser beam from the off-axis paraboloidal concave mirror 813 is incident thereon. The off-axis paraboloidal convex mirror 814 may be oriented to reflect the laser beam from the off-axis paraboloidal concave mirror 813 toward the beam delivery unit 50 (see FIG. 2).

The mirror fixing plate 815 may be movable in the direction indicated by the arrow Y in FIG. 14B through the aforementioned driving mechanism. Then, a distance from the mirror fixing plate 815 to the flat mirror 811 and the off-axis paraboloidal concave mirror 814 may be adjusted. The wavefront of the laser beam may be adjusted by adjusting the distance from the mirror fixing plate 815 to the flat mirror 811 and the off-axis paraboloidal concave mirror 814. The configuration and the function of the second wavefront adjuster 82 in the third example may be substantially the same as those of the above-described first wavefront adjuster 81.

Figure 15:
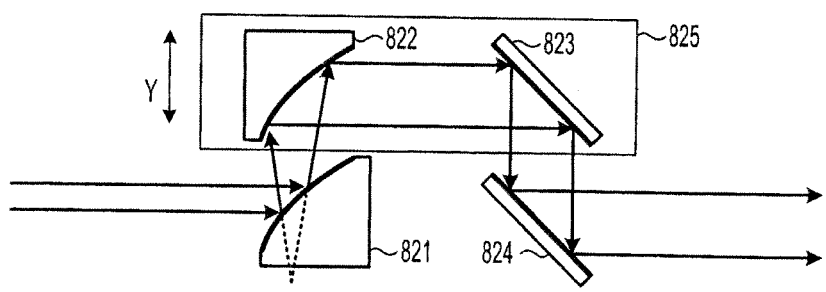
FIG. 15 schematically illustrates a fourth example of a wavefront adjuster in the EUV light generation system according to the first embodiment.

3.5.4 Combination of Off-Axis Paraboloidal Convex Mirror and Off-Axis Paraboloidal Concave Mirror FIG. 15 schematically illustrates a fourth example of a wavefront adjuster in the EUV light generation system according to the first embodiment. In the fourth example, the wavefront adjuster may include an off-axis paraboloidal convex mirror 821, an off-axis paraboloidal concave mirror 822, two flat mirrors 823 and 824, a mirror fixing plate 825, and a driving mechanism (not separately shown).

The off-axis paraboloidal convex mirror 821 of the first wavefront adjuster 81 in the fourth example may be held by a mirror holder (not separately shown) to be positioned such that a laser beam outputted from the laser apparatus 3 (see FIG. 2) is incident thereon. The laser beam from the laser apparatus 3 may be reflected by the off-axis paraboloidal convex mirror 821 toward the off-axis paraboloidal concave mirror 822.

The off-axis paraboloidal concave mirror 822 may be fixed to the mirror fixing plate 825 through a mirror holder (not separately shown). The off-axis paraboloidal concave mirror 822 may be oriented to reflect the laser beam from the off-axis paraboloidal convex mirror 821 toward the flat mirror 823.

The flat mirror 823 may be fixed to the mirror fixing plate 825 through another mirror holder (not separately shown). The flat mirror 823 may be oriented to reflect the laser beam from the off-axis paraboloidal concave mirror 822 toward the flat mirror 824.

The flat mirror 824 may be held by a mirror holder (not separately shown) to be positioned such that the laser beam reflected by the flat mirror 823 is incident thereon. The flat mirror 824 may be oriented to reflect the laser beam from the flat mirror 823 toward the beam delivery unit 50 (see FIG. 2).

The mirror fixing plate 825 may be movable in the direction indicated by the arrow Y through the aforementioned driving mechanism so that a distance from the mirror fixing plate 825 to the off-axis paraboloidal convex mirror 821 and the flat mirror 824 is adjusted. The wavefront of the laser beam may be adjusted by adjusting the distance from the mirror fixing plate 825 to the off-axis paraboloidal convex mirror 821 and the flat mirror 824. The configuration and the function of the second wavefront adjuster 82 in the fourth example may be substantially the same as those of the above-described first wavefront adjuster 81.

3.5.5 Using VRM

Figure 16A:
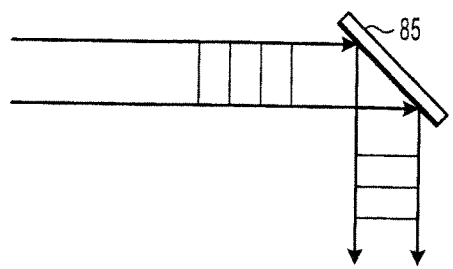
FIG. 16A schematically illustrates a fifth example of a wavefront adjuster in the EUV light generation system according to the first embodiment.
Figure 16B:
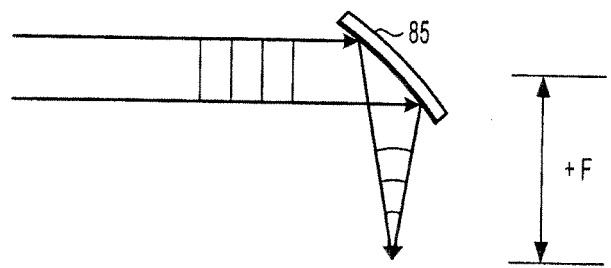
FIG. 16B further schematically illustrates the fifth example of the wavefront adjuster in the EUV light generation system according to the first embodiment.
Figure 16C:
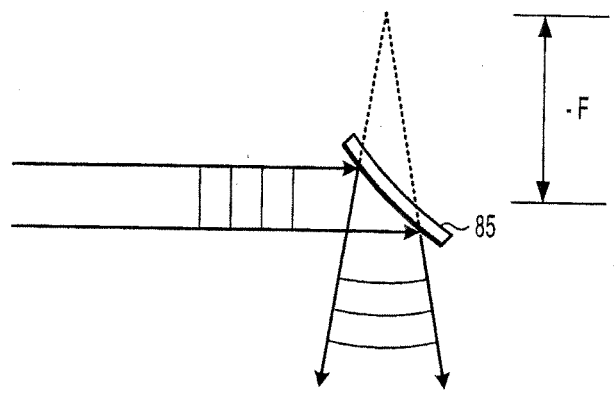
FIG. 16C still further schematically illustrates the fifth example of the wavefront adjuster in the EUV light generation system according to the first embodiment.

FIGS. 16A through 16C schematically illustrate a fifth example of a wavefront adjuster in the EUV light generation system according to the first embodiment. In the fifth example, the wavefront adjuster may include a variable radius mirror (VRM) 85.

The VRM 85 may be a mirror of which the curvature of the reflective surface can be modified. The VRM 85 may be transformed to have a flat reflective surface as shown in FIG. 16A, a concave reflective surface having a focal length +F as shown in FIG. 16B, or a convex reflective surface having a focal length −F as shown in FIG. 16C. Thus, the wavefront of the laser beam may be adjusted using the VRM 85.

Figure 17A:
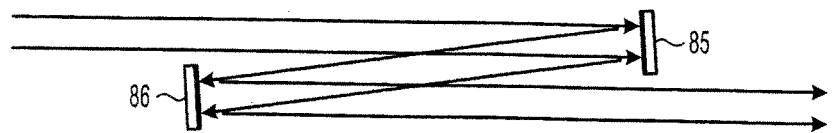
FIG. 17A schematically illustrates a sixth example of a wavefront adjuster in the EUV light generation system according to the first embodiment.
Figure 17B:
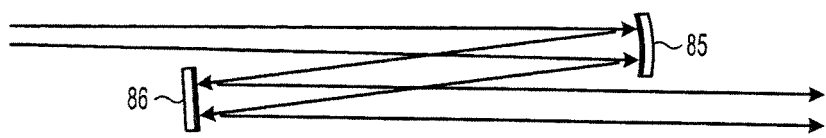
FIG. 17B further schematically illustrates the sixth example of the wavefront adjuster in the EUV light generation system according to the first embodiment.
Figure 17C:
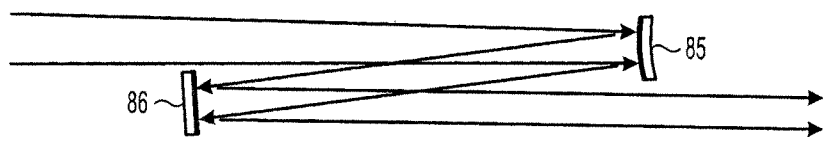
FIG. 17C still further schematically illustrates the sixth example of the wavefront adjuster in the EUV light generation system according to the first embodiment.

FIGS. 17A through 17C schematically illustrate a sixth example of a wavefront adjuster in the EUV light generation system according to the first embodiment. In the sixth example, the wavefront adjuster may include the VRM 85 and a flat mirror 86.

The VRM 85 may be the same as the VRM 85 of the fifth example described above. The VRM 85 of the first wavefront adjuster 81 in the sixth example may be held by a mirror holder (not separately shown) to be positioned such that a laser beam outputted from the laser apparatus 3 (see FIG. 2) is incident thereon. The laser beam from the laser apparatus 3 may be reflected by the VRM 85 toward the flat mirror 86.

The flat mirror 86 may be held by a mirror holder (not separately shown) to be positioned in a beam path of a laser beam reflected by the VRM 85. The flat mirror 86 may be oriented to reflect the laser beam from the VRM 85 toward the beam delivery unit 50 (see FIG. 2).

In the above-described configuration, by adjusting the curvature of the reflective surface of the VRM 85, the wavefront of the laser beam reflected thereby may be adjusted.

Figure 18:
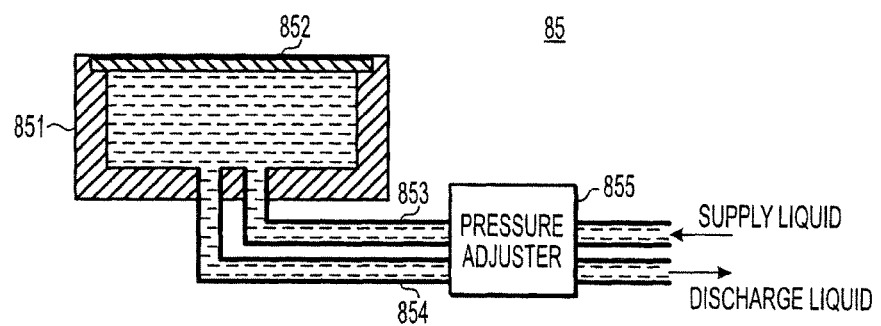
FIG. 18 is a fragmentary sectional view showing a configuration of a VRM used in the fifth and sixth examples of the wavefront adjuster.

FIG. 18 is a fragmentary sectional view showing a configuration of the VRM used in the fifth and sixth examples of the wavefront adjuster. The VRM 85 may include a pressure cavity 851, a reflector 852, a supply pipe 853, a discharge pipe 854, and a pressure adjuster 855.

The pressure cavity 851 may be a rigid container in which a liquid such as water is stored. The reflector 852 may be elastic and be fitted into an opening in the pressure cavity 851. A reflective layer may be formed on one surface of the reflector 852 which reflects a laser beam with high reflectance, and this surface may be exposed to the exterior of the pressure cavity 851 to serve as the reflective surface.

A first end of each of the supply pipe 853 and the discharge pipe 854 may be connected to the pressure cavity 851, and a second end of each of the supply pipe 853 and the discharge pipe 854 may be connected to the pressure adjuster 855.

The pressure adjuster 855 may supply or discharge a liquid into or from the pressure cavity 851 through the supply pipe 853 or the discharge pipe 854 to increase or decrease a pressure inside the pressure cavity 851 based on a control signal from the controller 58. By increasing or decreasing a pressure inside the pressure cavity 851, the radius of the curvature of the reflective layer may be changed, and thus the wavefront curvature of the laser beam reflected by the reflective layer may be adjusted.

3.5.6 Using Deformable Mirror

Figure 19:
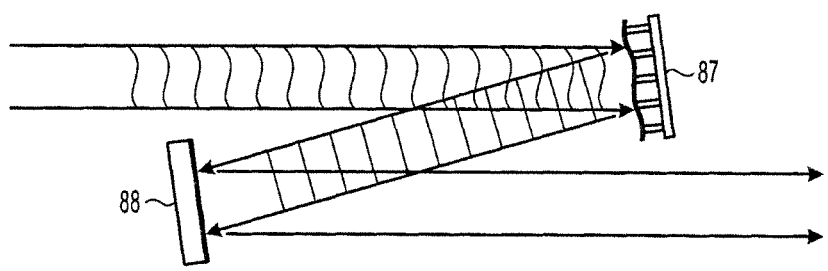
FIG. 19 schematically illustrates a seventh example of a wavefront adjuster in the EUV light generation system according to the first embodiment.

FIG. 19 schematically illustrates a seventh example of a wavefront adjuster in the EUV light generation system according to the first embodiment. In the seventh example, the wavefront adjuster may include a deformable mirror 87.

The deformable mirror 87 of the first wavefront adjuster 81 of the seventh example may be held by a mirror holder (not separately shown) to be positioned in a beam path of a laser beam outputted from the laser apparatus 3 (see FIG. 2). The deformable mirror 87 may be capable of compensating a wavefront curvature of even a laser beam having an aspherical wavefront with high precision by controlling the shape of its reflective surface.

The wavefront adjuster of the seventh example may further include a flat mirror 88. The deformable mirror 87 may be oriented to reflect the laser beam from the laser apparatus 3 toward the flat mirror 88.

The flat mirror 88 may be held by a mirror holder (not separately shown) to be positioned in a beam path of a laser beam reflected by the deformable mirror 87. The flat mirror 88 may be oriented to reflect the laser beam from the deformable mirror 87 toward the beam delivery unit 50 (see FIG. 2).

Figure 20A:
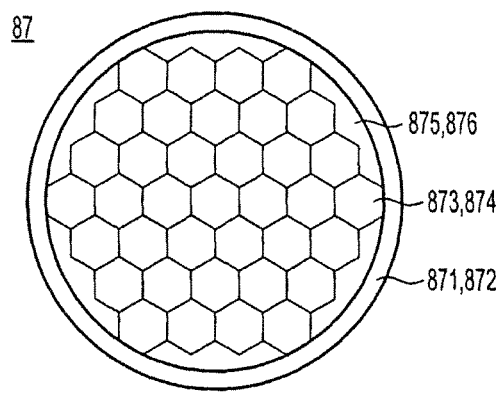
FIG. 20A is a plan view showing a configuration of a deformable mirror used in the seventh example of the wavefront adjuster.
Figure 20B:
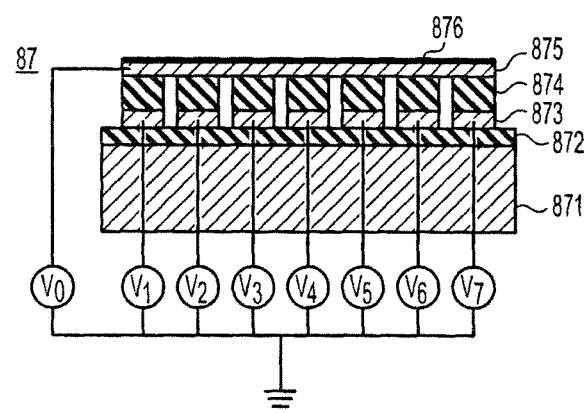
FIG. 20B is a fragmentary sectional view of the deformable mirror shown in FIG. 20A.

FIG. 20A is a plan view showing a configuration of the deformable mirror in the wavefront adjuster of the seventh example. FIG. 20B is a fragmentary sectional view of the deformable mirror shown in FIG. 20A. The deformable mirror 87 may include a substrate 871, an insulating layer 872, a plurality of lower electrodes 873, a plurality of piezoelectric members 874, an upper electrode 875, and a reflective layer 876.

The substrate 871 may serve as a base of the deformable mirror 87. The insulating layer 872 may formed on the substrate 871. The plurality of the lower electrodes 873 may be formed on the insulating layer 872 to be spaced apart from one another. The plurality of piezoelectric members 874 may be formed on the respective lower electrodes 873. The upper electrode 875 may be formed across the plurality of piezoelectric members 874 to serve as a common electrode. The reflective layer 876 may be formed on the upper electrode 875. The reflective layer 876 may be configured to reflect a laser beam with high reflectance.

With the above-described configuration, a common potential $V_0$ may be applied to the upper electrode 875 and potentials $V_1$ through $V_7$ may be applied to the respective lower electrodes 873 through a potential control circuit (not separately show). Accordingly, each of the piezoelectric members 874 may deform independently, and the shape of the reflective layer 876 may be varied.

4. EUV Light Generation System Including Guide Laser Device

Second Embodiment 4.1 Configuration

Figure 21:
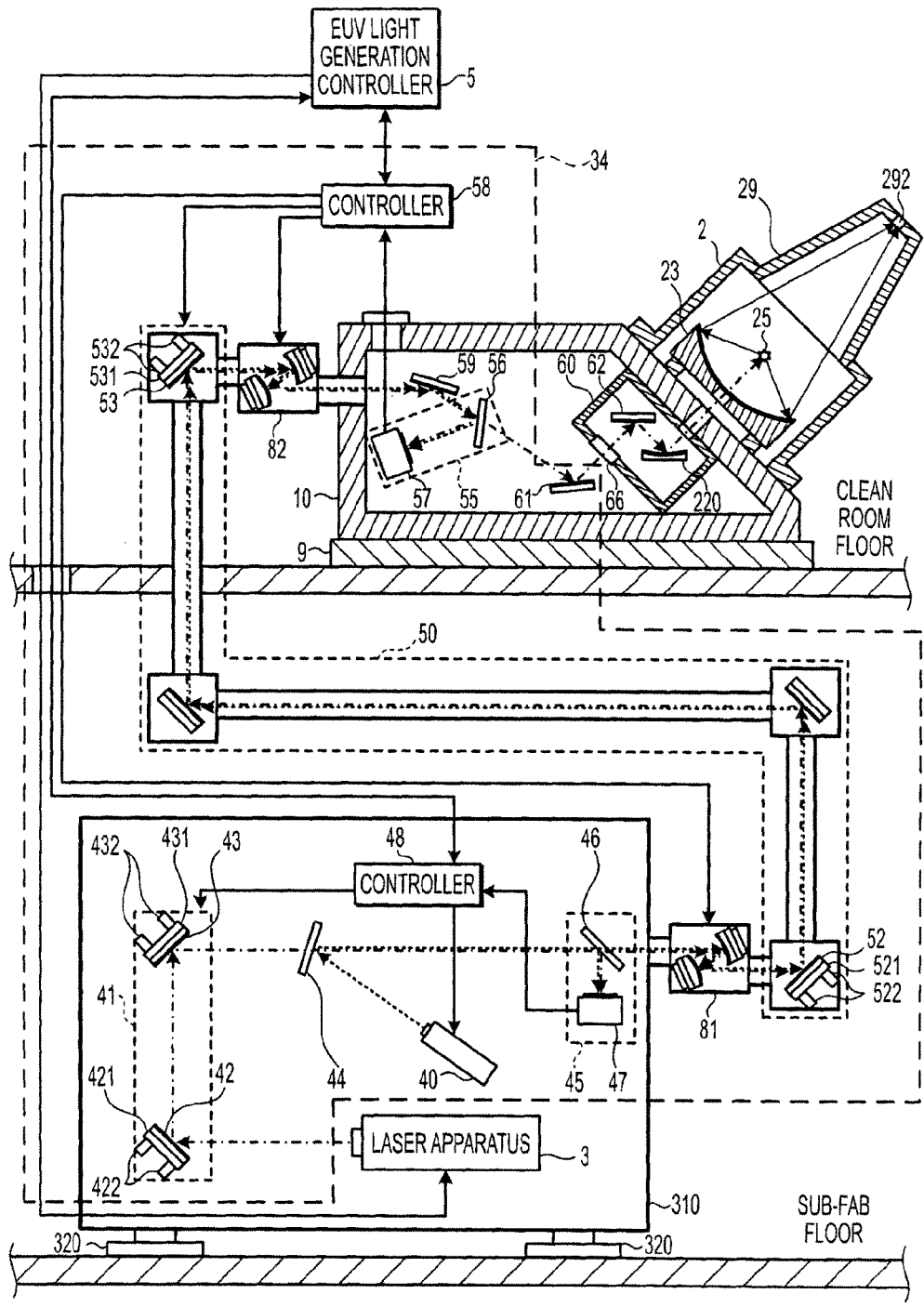
FIG. 21 is a partial sectional view illustrating an exemplary configuration of an EUV light generation system according to a second embodiment of the present disclosure.

FIG. 21 is a partial sectional view illustrating an exemplary configuration of an EUV light generation system according to a second embodiment of the present disclosure. The EUV light generation system according to the second embodiment may include a laser beam direction adjusting mechanism 41, a beam combiner 44, and an optical detector 45, which are arranged in this order along a beam path from the laser apparatus 3 to the beam delivery unit 50 in the sub-fab floor. A guide laser device 40 may further be provided, and the beam combiner 44 may be positioned such that a guide laser beam from the guide laser device 40 is incident on the beam combiner 44. A controller 48 may further be provided. Here, if the controller 58 can fulfill the function of the controller 48, the controller 48 may be omitted. In that case, each component to be connected to the controller 48 may be connected to the controller 58.

The guide laser device 40 may be configured to output a continuous wave (CW) laser beam or a pulse laser beam at a predetermined repetition rate. Average energy of the guide laser beam may be lower than average energy of the laser beam from the laser apparatus 3. The wavelength of the guide laser beam may differ from the wavelength of the laser beam from the laser apparatus 3.

The laser beam direction adjusting mechanism 41 may include high-reflection mirrors 42 and 43. The high-reflection mirror 42 may be held by a mirror holder 421, and the mirror holder 421 may be provided with an actuator 422 which adjusts the position and posture of the high-reflection mirror 42. Similarly, the high-reflection mirror 43 may be held by a mirror holder 431, and the mirror holder 431 may be provided with an actuator 432 which adjusts the position and posture of the high-reflection mirror 43. As the positions and the postures of the high-reflection mirrors 42 and 43 are adjusted, a direction in which a laser beam from the laser apparatus 3 travels may be adjusted.

The beam combiner 44 may include a dichroic mirror. The beam combiner 44 may be positioned such that the laser beam from the laser apparatus 3 is incident on a first surface thereof and the guide laser beam from the guide laser device 40 is incident on a second surface thereof. The beam combiner 44 may be configured to transmit the laser beam incident on the first surface and reflect the guide laser beam incident on the second surface. The beam combiner 44 may be arranged at a predetermined angle with respect to the beam paths of the guide laser beam and the laser beam so that the beam path of the laser beam transmitted therethrough and the beam path of the guide laser beam reflected thereby substantially coincide with each other.

The optical detector 45 may include a beam sampler 46 and a second beam monitor 47. The beam sampler 46 may transmit both the laser beam from the laser apparatus 3 and the guide laser beam from the guide laser device 40 with high transmittance and reflect a part of the laser beam and a part of the guide laser beam respectively as sample beams. The sample beams may then be incident on the photosensitive surface of the second beam monitor 47. The second beam monitor 47 may be configured to detect positions at which the respective samples beams are incident on the photosensitive surface thereof and output a detection result.

The controller 48 may receive a control signal from the EUV light generation controller 5 and operate as follows. The controller 48 may obtain a difference, if any, between a direction in which the laser beam transmitted through the beam combiner 44 travels and a direction in which the guide laser beam reflected by the beam combiner 44 travels based on detection results of the respective sample beams by the second beam monitor 47. This difference may be obtained from a difference in positions at which the laser beam and the guide laser beam are incident on photosensitive surface of the second beam monitor 47. The controller 48 may control the laser beam direction adjusting mechanism 41 to reduce the difference, if any, in the directions of the laser beam and the guide laser beam. In the laser beam direction adjusting mechanism 41, an actuator driver (not separately shown) may receive a control signal from the controller 48 and drive the actuators 422 and 423 to thereby adjust a direction in which the laser beam from the laser apparatus 3 travels. Further, the controller 48 may send a control signal to the guide laser device 40 to control the output of the guide laser beam.

In the second embodiment, the beam delivery unit 50 may include high-reflection mirrors 52 and 53. The high-reflection mirror 52 may be held by a mirror holder 521, and the mirror holder 521 may be provided with an actuator 522 which adjusts the position and posture of the high-reflection mirror 52. Similarly, the high-reflection mirror 53 may be held by a mirror holder 531, and the mirror holder 531 may be provided with an actuator 532 which adjusts the position and posture of the high-reflection mirror 53. As the positions and the postures of the high-reflection mirrors 52 and 53 are adjusted, directions in which the laser beam and the guide laser beam travel may be adjusted.

The high-reflection mirror 59 may be positioned to reflect the laser beam and the guide laser beam guided into the clean room floor through the beam delivery unit 50 toward the beam splitter 56. The beam splitter 56 may be configured and positioned to transmit the laser beam from the high-reflection mirror 59 toward the high-reflection mirror 61 with high transmittance. The beam splitter 56 may also be configured and positioned to reflect the guide laser beam from the high-reflection mirror 59 toward the first beam monitor 57 with high reflectance as a sample guide beam. The first beam monitor 57 may be configured to obtain a beam width, a wavefront, and a position of the sample guide beam at the photosensitive surface thereof and output a detection result to the controller 58.

The controller 58 may control the beam delivery unit 50 based on the position of the sample guide beam detected by the first beam monitor 57 so that the laser beam is focused in the plasma generation region 25. In the beam delivery unit 50, an actuator driver (not separately shown) may receive a control signal from the controller 58 and drive the actuators 522 and 532 to thereby adjust directions in which the laser beam and the guide laser beam travel.

According to the second embodiment, the sample guide beam may be detected by the first beam monitor 57, and the controller 58 may control the beam delivery unit 50 accordingly. Thus, the travel direction of the laser beam may be stabilized. Further, even when the laser beam is not outputted from the laser apparatus 3, the controller 58 may be capable of controlling the beam delivery unit 50 based on a detection result of the guide laser beam. Accordingly, the travel direction of the laser beam may be controlled to a predefined direction from the beginning of the output of the laser beam, and thus the focus position of the laser beam striking the target material in the chamber may be stabilized.

Further, according to the second embodiment, even when the laser beam is not outputted from the laser apparatus 3, the controller 58 may be capable of controlling the first wavefront adjuster 81 and the second wavefront adjuster 82 based on the wavefront of the guide laser beam detected by the first beam monitor 57. Accordingly, the beam width and the wavefront of the laser beam may be controlled to fall within respective predetermined ranges from the beginning of the output of the laser beam, and thus the focus position of the laser beam striking the target material in the chamber may be stabilized.

Alternatively, the beam splitter 56 may also reflect a part of the laser beam as a sample laser beam toward the first beam monitor 57. Then, the first beam monitor 57 may receive both the guide laser beam and the laser beam reflected by the beam splitter 56 and output a detection result. In this case, the laser beam direction adjusting mechanism 41 may be controlled based on the detection result from the first beam monitor 57. Further, the beam width and the wavefront curvature of both the guide laser beam and the laser beam may be calculated from the detection result of the first beam monitor 57.

Figure 22A:
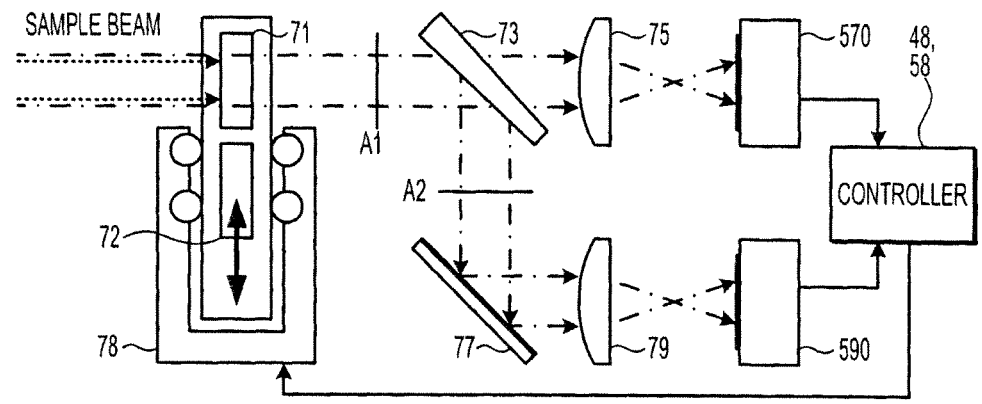
FIG. 22A schematically illustrates a first example of a beam monitor in the EUV light generation system according to the second embodiment.
Figure 22B:
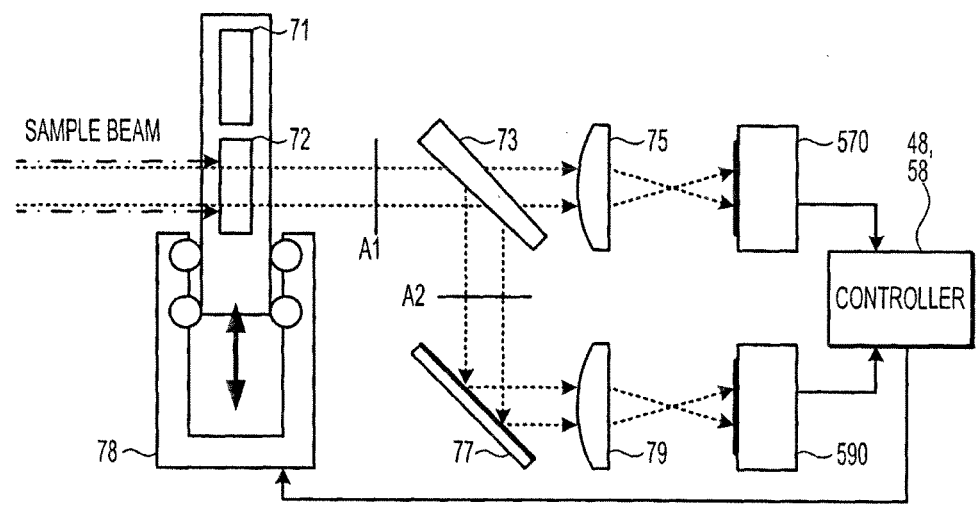
FIG. 22B further schematically illustrates the first example of the beam monitor in the EUV light generation system according to the second embodiment.

4.2 Examples of Beam Monitor
4.2.1 Detecting Beam Width at Two Difference Positions FIGS. 22A and 22B schematically illustrate a first example of a beam monitor in the EUV light generation system according to the second embodiment. In the first example, the first or second beam monitor 47 or 57 capable of receiving both the laser beam and the guide laser beam may include band-pass filters 71 and 72.

The band-pass filters 71 and 72 may be movable through an actuator 78. The actuator 78 may be controlled by the controller 48 or 58. The band-pass filter 71 may be configured to transmit the laser beam from the laser apparatus 3 with high transmittance and attenuate or block rays at other wavelengths. The band-pass filter 72 may be configured to transmit the guide laser beam and attenuate or block rays at other wavelengths.

As shown in FIG. 22A, when the actuator 78 moves the band-pass filter 71 into a beam path of the sample beam, the laser beam component may reach the beam splitter 73. Accordingly, the position, the direction, the beam width, and the wavefront curvature of the laser beam may be obtained by the controller 48 or 58.

As shown in FIG. 22B, when the actuator 78 moves the band-pass filter 72 into a beam path of the sample beam, the guide laser beam component may reach the beam splitter 73. Accordingly, the position, the direction, the beam width, and the wavefront curvature of the guide laser beam may be obtained by the controller 48 or 58.

Here, the transfer optical systems 75 and 79 may preferably have a function of compensating for chromatic aberration for the wavelengths of both the laser beam and the guide laser beam. For example, each of the transfer optical systems 75 and 79 may include an achromatic lens. Further, the transfer optical system 75 or 79 may preferably be configured such that chromatic aberration is small in principle.

According to the first example, the beam profilers 570 and 590 of the same type may be used to detect both the laser beam and the guide laser beam, and thus a difference between the directions in which the laser beam and the guide laser beam travel may be detected with high precision.

4.2.2 Detecting Beam Width and Beam Spot Width

Figure 23:
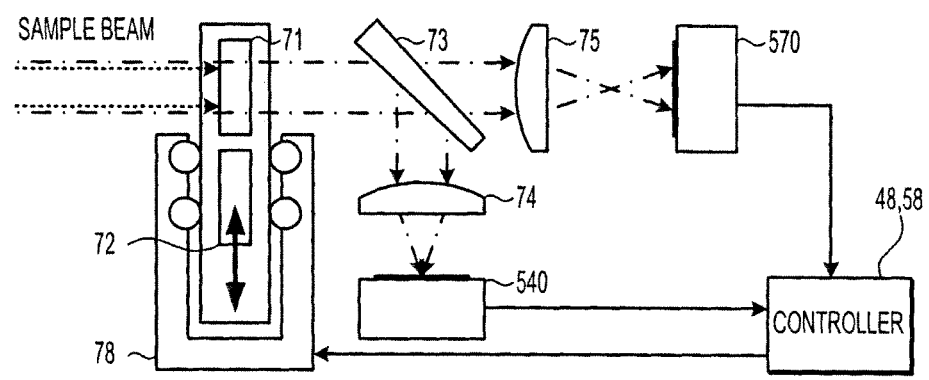
FIG. 23 schematically illustrates a second example of a beam monitor in the EUV light generation system according to the second embodiment.

FIG. 23 schematically illustrates a second example of a beam monitor in the EUV light generation system according to the second embodiment. In the second example, the first or second beam monitor 47 or 57 capable of receiving the laser beam and the guide laser beam may include the band-pass filters 71 and 72.

The band-pass filters 71 and 72 may be movable through the actuator 78. The actuator 78 may be controlled by the controller 48 or 58. The band-pass filter 71 may be configured to transmit the laser beam from the laser apparatus 3 with high transmittance and attenuate or block rays at other wavelengths. The band-pass filter 72 may be configured to transmit the guide laser beam with high transmittance and attenuate or block rays at other wavelengths.

When the actuator 78 moves the band-pass filter 71 into a beam path of the sample beam, the laser beam component may reach the beam splitter 73. Accordingly, the position, the direction, the beam width, and the wavefront curvature of the laser beam may be obtained by the controller 48 or 58.

When the actuator 78 moves the band-pass filter 72 into a beam path of the sample beam, the guide laser beam component may reach the beam splitter 73. Accordingly, the position, the direction, the beam width, and the wavefront curvature of the guide laser beam may be obtained by the controller 48 or 58.

Here, the focusing optical system 74 and the transfer optical system 75 may preferably have a function of compensating for chromatic aberration for the wavelengths of both the laser beam and the guide laser beam. For example, each of the focusing optical system 74 and the transfer optical system 75 may include an achromatic lens. Further, the focusing optical system 74 and the transfer optical system 75 may preferably be configured such that chromatic aberration is small in principle.

According to the second example, the beam profilers 540 and 570 of the same type may be used to detect the laser beam and the guide laser beam, and thus a difference between the directions in which the laser beam and the guide laser beam travel may be detected with high precision.

4.2.3 Using Shack-Hartmann Wavefront Sensor

Figure 24:
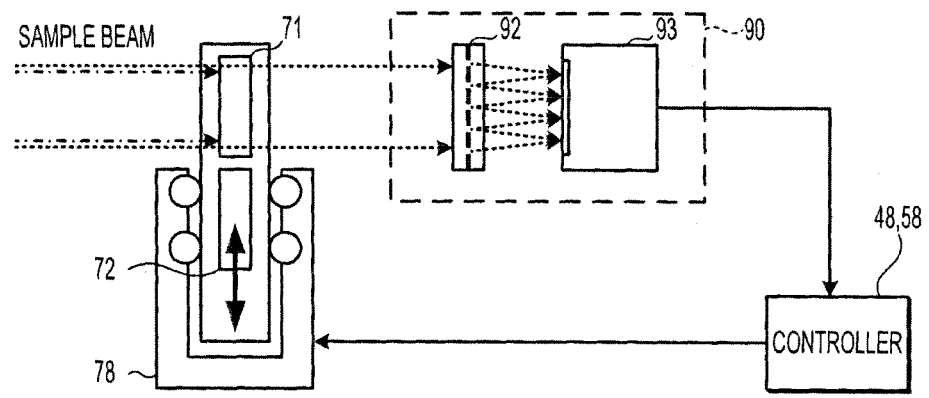
FIG. 24 schematically illustrates a third example of a beam monitor in the EUV light generation system according to the second embodiment.

FIG. 24 schematically illustrates a third example of a beam monitor in the EUV light generation system according to the second embodiment. In the third example, the first or second beam monitor 47 or 57 capable of receiving both the laser beam and the guide laser beam may include the band-pass filters 71 and 72. Further, in the Shack-Hartmann wavefront sensor 90, a screen 92 having a number of pinholes may be used in place of the microlens array 91.

The band-pass filters 71 and 72 may be movable through the actuator 78. The actuator 78 may be controlled by the controller 48 or 58. The band-pass filter 71 may be configured to transmit the laser beam from the laser apparatus 3 with high transmittance and attenuate or block rays at other wavelengths. The band-pass filter 72 may be configured to transmit the guide laser beam with high transmittance and attenuate or block rays at other wavelengths.

When the actuator 78 moves the band-pass filter 71 into a beam path of the sample beam, the laser beam component may reach the Shack-Hartmann wavefront sensor 90. Accordingly, the position, the direction, the beam width, and the wavefront curvature of the laser beam may be obtained by the controller 48 or 58.

When the actuator 78 moves the band-pass filter 72 into a beam path of the sample beam, the guide laser beam component may reach the Shack-Hartmann wavefront sensor 90. Accordingly, the position, the direction, the beam width, and the wavefront curvature of the guide laser beam may be obtained by the controller 48 or 58.

According to the third example, the Shack-Hartmann wavefront sensor 90 may be used commonly to detect both the laser beam and the guide laser beam, and thus a difference between the directions in which the laser beam and the guide laser beam travel may be detected with high precision.

4.3 Operation

In the EUV light generation system of the second embodiment configured as such, the controller 58 may control the first beam monitor 57 to receive the sample guide beam and obtain the beam width and the wavefront curvature of the guide laser beam to thereby control the first wavefront adjuster 81 and the second wavefront adjuster 82. The controller 58 may carry out the same operations as those shown in the flowcharts of FIGS. 5, 6A, 6B, 7A, and 7B. Here, the laser beam in FIGS. 5, 6A and 7A may be replaced by the guide laser beam.

Further, the following two steps may be added to the operation to control the first wavefront adjuster 81 shown in FIG. 6A. First, the band-pass filter 72 may be disposed in a beam path of the sample beam to allow the guide laser beam component to pass through. Then, a control signal may be sent to the controller 48 to control the guide laser device 40 to output the guide laser beam. Thereafter, the operation in Steps S110 through S150 may be carried out.

4.4 Arrangement of Laser Amplifiers

Figure 25:
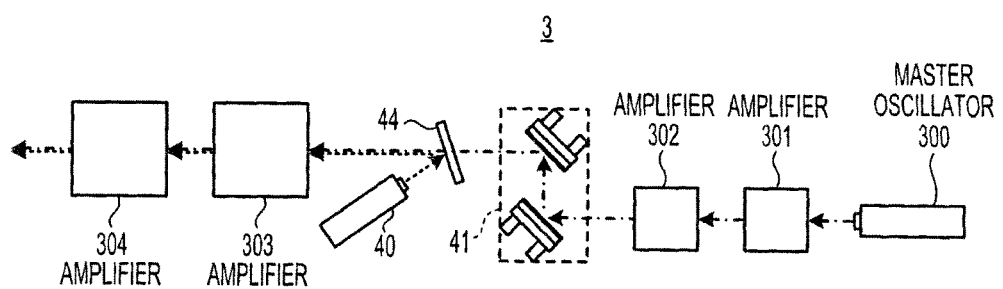
FIG. 25 schematically illustrates a laser apparatus according to a modification of the second embodiment.

FIG. 25 schematically illustrates a modification of the second embodiment, in which amplifiers are further provided in the EUV light generation system. In this modification, the laser apparatus 3 may include a master oscillator 300 and amplifiers 301 through 304. Further, the beam direction adjusting mechanism 41, the beam combiner 44, and the guide laser device 40 may be included in the laser apparatus 3. The laser beam direction adjusting mechanism 41 and the beam combiner 44 may be provided between the amplifier 302 and the amplifier 303.

The master oscillator 300 may output a seed beam of a laser beam. The amplifier 301 may amplify the seed beam from the master oscillator 300, and the amplifier 302 may further amplify an amplified laser beam from the amplifier 301. The amplified laser beam may then travel through the laser beam direction adjusting mechanism 41 to enter the beam combiner 44.

The amplifier 303 may amplify at least the laser beam of the laser beam and the guide laser beam from the beam combiner 44. The amplifier 304 may further amplify at least the laser beam of the laser beam and the guide laser beam outputted from the amplifier 303. The laser beam and the guide laser beam outputted from the amplifier 304 may then enter the optical detector 45 as described with reference to FIG. 21.

In an EUV light generation system, a high-energy laser beam may be required to strike a target in order to output EUV light having desired energy. As the energy of the laser beam increases, optical elements provided in its beam path may be subjected to a high heat load and may deform. Then, a direction in which the laser beam travels may be changed. In particular, when multiple amplifiers are used, the energy of the laser beam may become higher toward the downstream-side amplifier(s). Accordingly, a change in the wavefront of the laser beam may become greater toward the downstream-side amplifier(s).

According to the configuration shown in FIG. 25, the beam combiner 44 may be provided between the amplifiers 302 and 303, and the beam paths of the laser beam and the guide laser beam may be adjusted to coincide with each other while a change, if any, in the direction or the wavefront of the laser beam still is small. Accordingly, a difference between the direction or the wavefront of the laser beam and the direction or the wavefront of the guide laser beam is reduced with relative ease, and the direction or the wavefront of the laser beam may be adjusted with high precision.

5. EUV Light Generation System where Wavefront of Guide Laser Beam is Adjusted to Wavefront of Laser Beam

Third Embodiment

5.1 Configuration

Figure 26:
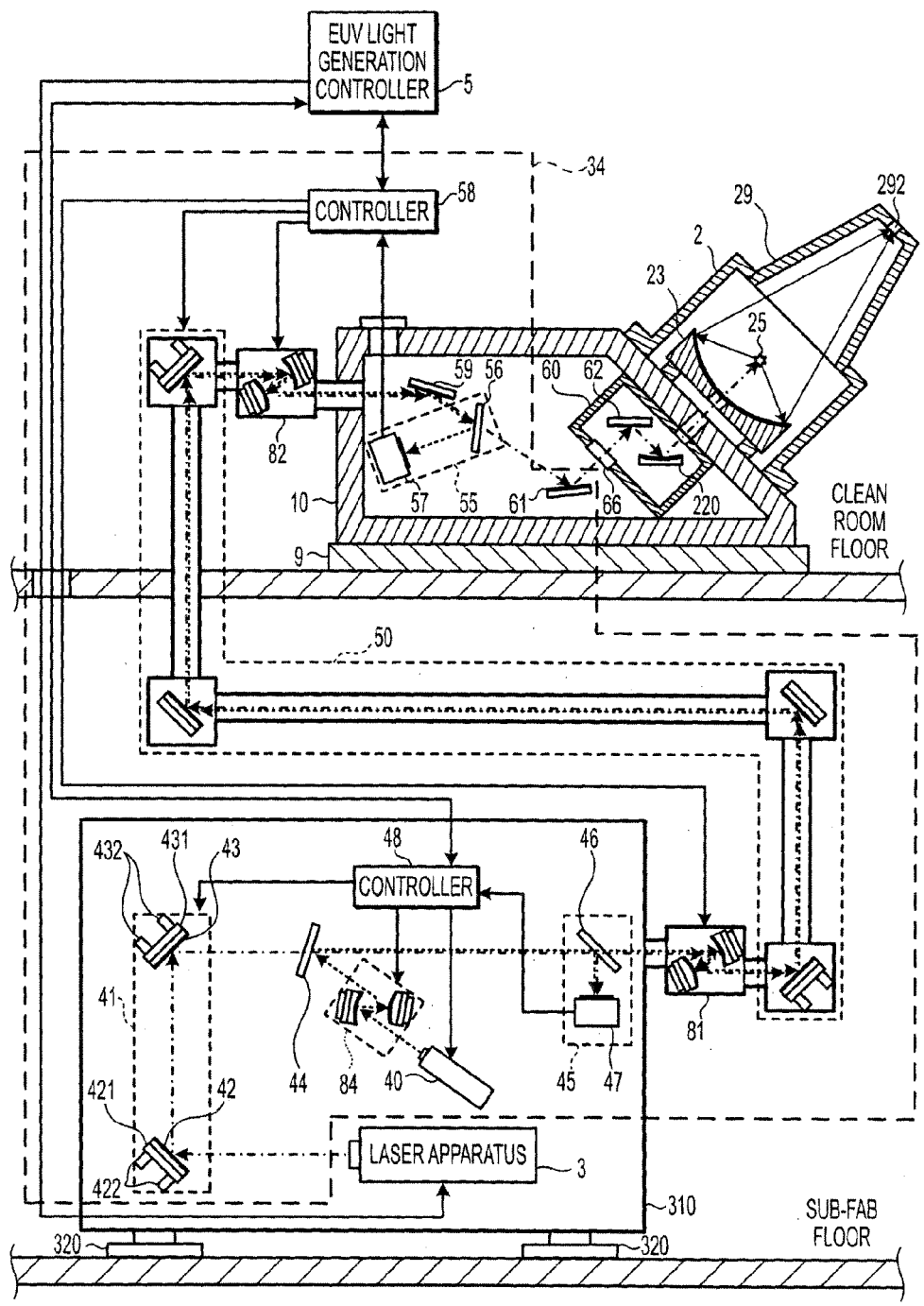
FIG. 26 is a partial sectional view illustrating an exemplary configuration of an EUV light generation system according to a third embodiment of the present disclosure.

FIG. 26 is a partial sectional view illustrating an exemplary configuration of an EUV light generation system according to a third embodiment of the present disclosure. The EUV light generation system according to the third embodiment may include a guide laser beam wavefront adjuster 84 provided between the guide laser device 40 and the beam combiner 44 in the sub-fab floor. The configuration of the guide laser beam wavefront adjuster 84 may be similar to the configuration of the first wavefront adjuster 81 or the second wavefront adjuster 82 described above.

In the third embodiment, the optical detector 45 may include the band-pass filters 71 and 72 and the actuator 78. The configuration and the operation of the band-pass filters 71 and 72 and the actuator 78 may be similar to those described above. The optical detector 45 may output a detection result to the controller 48, and the controller 48 may calculate the wavefront curvature of the laser beam and the wavefront curvature of the guide laser beam from the received detection result. The controller 48 may then control the guide laser beam wavefront adjuster 84 so that a difference, if any, between the wavefront curvature of the laser beam and the wavefront curvature of the guide laser beam decreases.

According to the third embodiment, a difference between the wavefront curvature of the laser beam and the wavefront curvature of the guide laser beam at the optical detector 45 may be reduced. Accordingly, by controlling the first wavefront adjuster 81 and the second wavefront adjuster 82 based on the wavefront of the guide laser beam detected by the optical detector 55, the wavefront of the laser beam to enter the optical detector 55 may be controlled with high precision.

5.2 Operation

Figure 27:
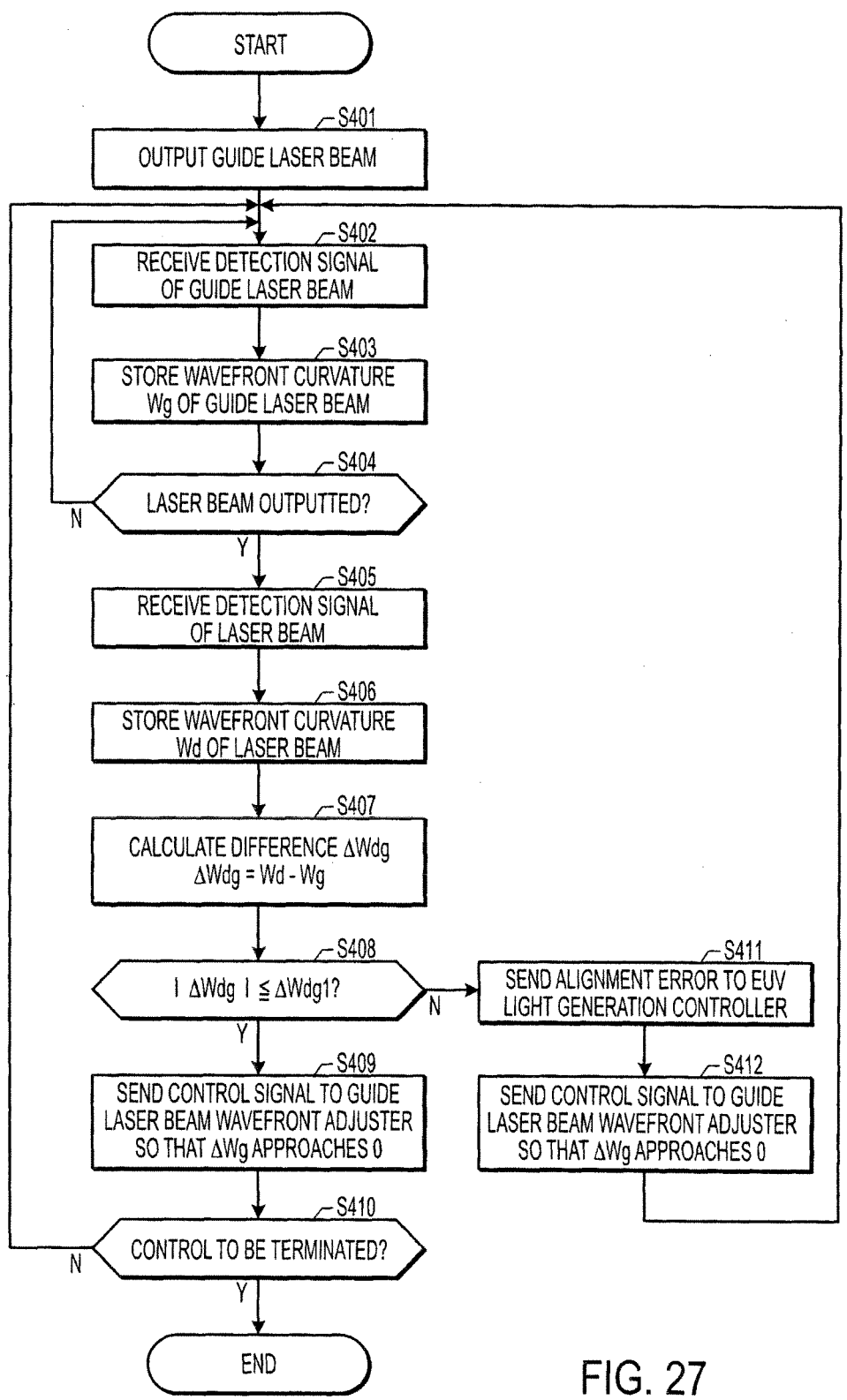
FIG. 27 is a flowchart showing an exemplary operation of a controller in the third embodiment.

FIG. 27 is a flowchart showing an exemplary operation of a controller in the third embodiment. The controller 48 may carry out the following operation to control the guide laser beam wavefront adjuster 84.

The controller 48 may first send a control signal to the guide laser device 40 to control the guide laser device 40 to start outputting the guide laser beam (Step S401). Then, the controller 48 may receive a detection signal of the guide laser beam from the second beam monitor 47 (Step S402). The controller 48 may calculate a wavefront curvature Wg of the guide laser beam from the received detection signal and store the wavefront curvature Wg in a storing unit (Step S403).

Then, the controller 48 may receive a signal from the EUV light generation controller 5 and determine whether or not a laser beam has been outputted from the laser apparatus 3 (Step S404). When a laser beam has not been outputted (Step S404; NO), the controller 48 may return to Step S402.

On the other hand, when a laser beam has been outputted (Step S404; YES), the controller 48 may receive a detection signal of the laser beam from the second beam monitor 47 (Step S405). The controller 48 may then calculate a wavefront curvature Wd of the laser beam from the received detection signal and store the wavefront curvature Wd in a storing unit (Step S406).

Subsequently, the controller 48 may calculate a difference ΔWdg between the wavefront curvature Wg of the guide laser beam and the wavefront curvature Wd of the laser beam through the following expression (Step S407).

$$\Delta Wdg = Wd - Wg$$

Then, the controller 48 may determine whether or not an absolute value |ΔWdg| of the difference ΔWdg is equal to or smaller than a predetermined threshold ΔWdg1 (Step S408).

When the absolute value |ΔWdg| is equal to or smaller than the threshold ΔWdg1 (Step S408; YES), the controller 48 may proceed to Step S409. In Step S409, the controller 48 may send a control signal to the guide laser beam wavefront adjuster 84 such that a subsequent instance of the difference ΔWdg approaches 0. Thereafter, the controller 48 may receive a signal from the EUV light generation controller 5 and determine whether or not the operation in this flowchart is to be terminated (Step S410). When a signal indicating termination of the control is received from the EUV light generation controller 5 (Step S410; YES), the operation may be terminated. When a signal indicating termination of the control is not received (Step S410; NO), the controller 48 may return to Step S402 and repeat the subsequent steps.

When the absolute value |ΔWdg| exceeds the threshold ΔWdg1 (Step S408; NO), the controller 48 may proceed to Step S411. In Step S411, the controller 48 may send a signal indicating an alignment error to the EUV light generation controller 5. Then, the controller 48 may send a control signal to the guide laser beam wavefront adjuster 84 such that a subsequent instance of the difference ΔWdg approaches 0 (Step S412). Thereafter, the controller 48 may return to Step S402 and repeat the subsequent steps.

6. EUV Light Generation System where Wavefront of Laser Beam is Adjusted to Wavefront of Guide Laser Beam

Fourth Embodiment

Figure 28:
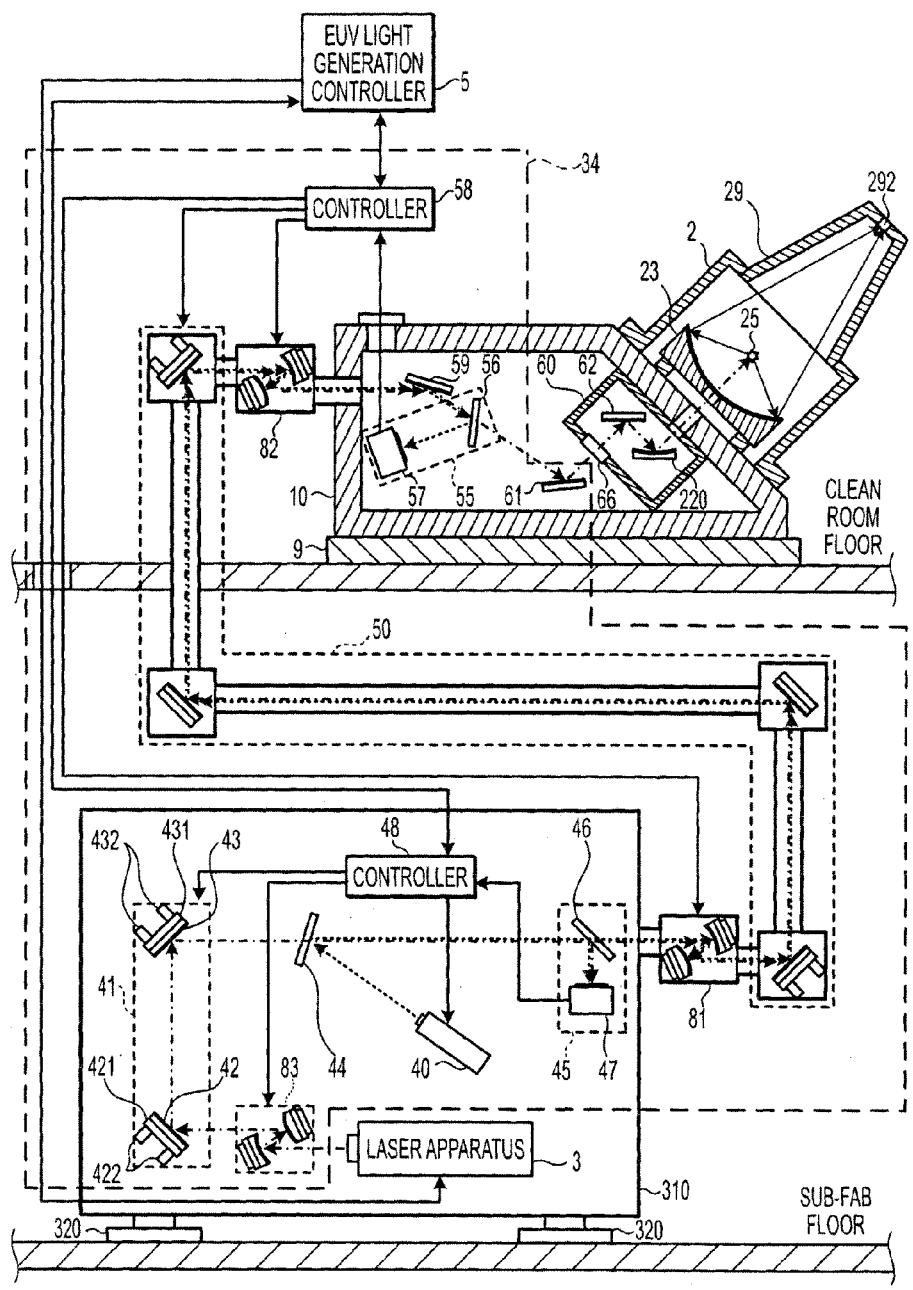
FIG. 28 is a partial sectional view illustrating an exemplary configuration of an EUV light generation system according to a fourth embodiment of the present disclosure.

FIG. 28 is a partial sectional view illustrating an exemplary configuration of an EUV light generation system according to a fourth embodiment of the present disclosure. The EUV light generation system according to the fourth embodiment may include a third wavefront adjuster 83 provided in a beam path of a laser beam outputted from the laser apparatus 3 in the sub-fab floor. The configuration of the third wavefront adjuster 83 may be similar to the configuration of the first wavefront adjuster 81 or the second wavefront adjuster 82.

In the fourth embodiment, the optical detector 45 may include the band-pass filters 71 and 72 and the actuator 78. The optical detector 45 may output a detection result to the controller 48, and the controller 48 may calculate the wavefront curvature of the laser beam and the wavefront curvature of the guide laser beam from the received detection result. The controller 48 may then control the third wavefront adjuster 83 so that a difference, if any, between the wavefront of the laser beam and the wavefront of the guide laser beam decreases.

According to the fourth embodiment, a difference between the wavefront of the laser beam and the wavefront of the guide laser beam to enter the optical detector 45 may be reduced. Accordingly, by controlling the first wavefront adjuster 81 and the second wavefront adjuster 82 based on the wavefront of the guide laser beam detected by the optical detector 55, the wavefront of the laser beam to enter the optical detector 55 may be controlled with high precision.

The operation of the controller 48 in the fourth embodiment may be similar to the operation of the controller 48 in the third embodiment, but the controller 48 may control the third wavefront adjuster 83 in the fourth embodiment in place of the guide laser beam wavefront adjuster 84.

7. EUV Light Generation System where Wavefront of Laser Beam and Wavefront of Guide Laser Beam are Adjusted

Fifth Embodiment

Figure 29:
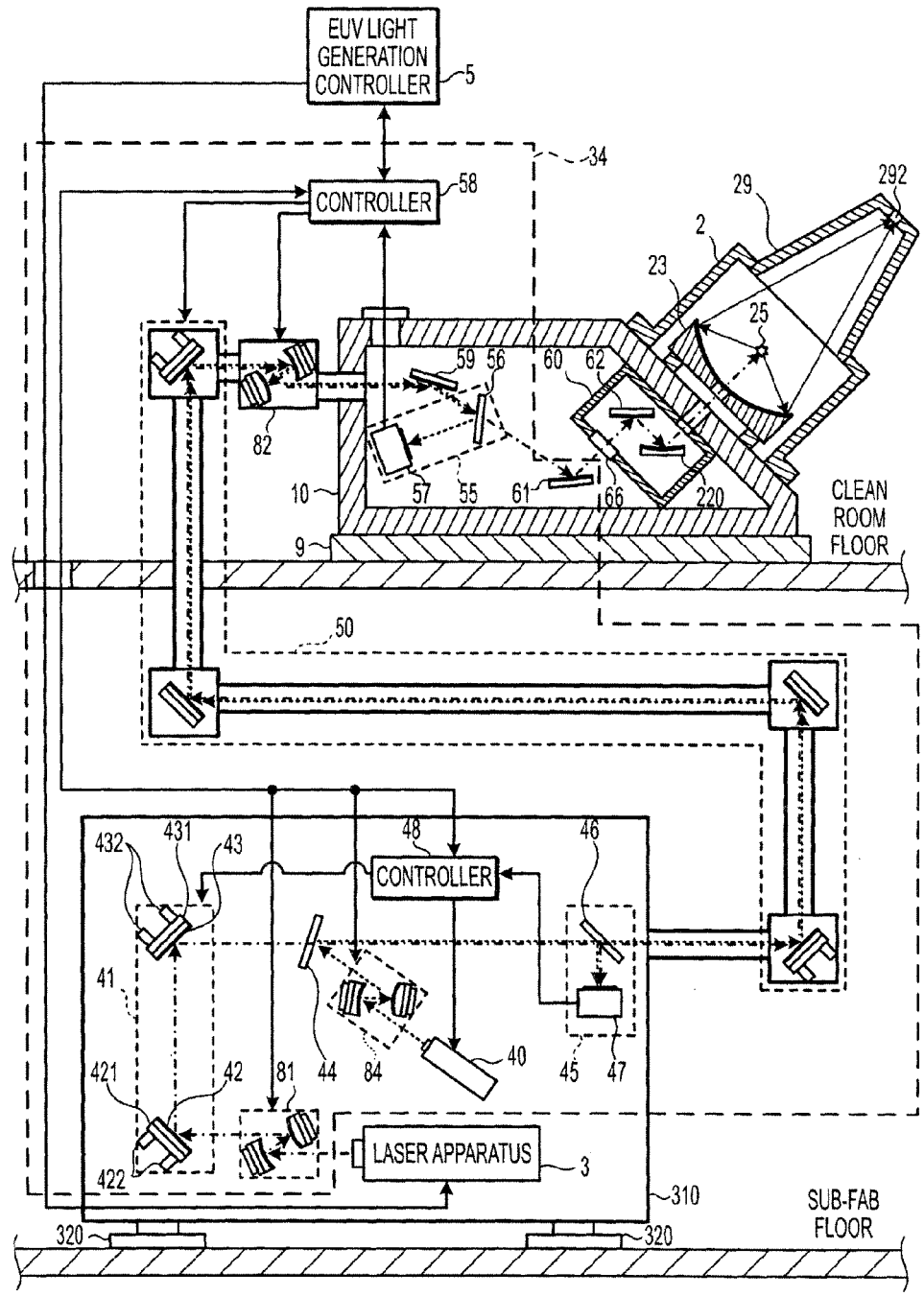
FIG. 29 is a partial sectional view illustrating an exemplary configuration of an EUV light generation system according to a fifth embodiment of the present disclosure.

FIG. 29 is a partial sectional view illustrating an exemplary configuration of an EUV light generation system according to a fifth embodiment of the present disclosure. The EUV light generation system according to the fifth embodiment may include the guide laser beam wavefront adjuster 84 provided between the guide laser device 40 and the beam combiner 44. Further, the first wavefront adjuster 81 may be provided upstream from the laser beam direction adjusting mechanism 41 in a beam path of a laser beam from the laser apparatus 3.

In the fifth embodiment, the optical detector 45 may include the band-pass filters 71 and 72 and the actuator 78. The optical detector 45 may output a detection result of the wavefront of the laser beam and the wavefront of the guide laser beam to the controller 48.

The controller 48 may then send the received detection result to the controller 58. Either of the controllers 48 and 58 may calculate the wavefront curvature of the laser beam and the wavefront curvature of the guide laser beam from the received detection result. When the controller 48 has calculated the wavefront curvature of the laser beam and the wavefront curvature of the guide laser beam, the controller 48 may send the calculation results to the controller 58.

The controller 58 may then control the guide laser beam wavefront adjuster 84 so that a difference, if any, between the wavefront of the laser beam and the wavefront of the guide laser beam decreases. The control of the guide laser beam wavefront adjuster 84 may be similar to that described with reference to FIG. 27.

According to the fifth embodiment, a difference between the wavefront of the laser beam and the wavefront of the guide laser beam to enter the optical detector 45 may be reduced. Accordingly, by controlling the first wavefront adjuster 81 and the second wavefront adjuster 82 based on the wavefront of the guide laser beam detected by the optical detector 55, the wavefront of the laser beam to enter the optical detector 55 may be controlled with high precision.

8. EUV Light Generation System Including Pre-Pulse Laser Apparatus

Sixth Embodiment

Figure 30:
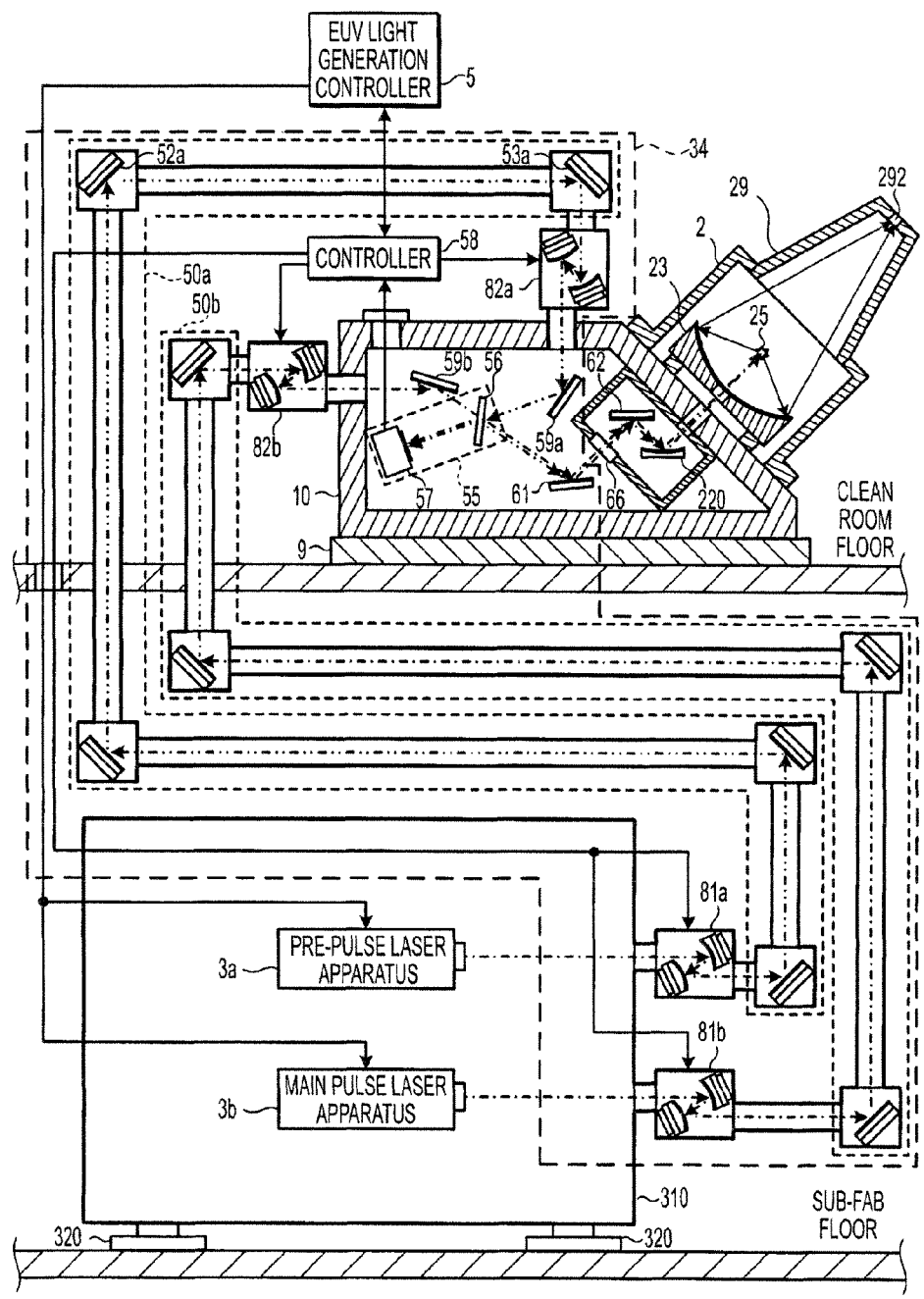
FIG. 30 is a partial sectional view illustrating an exemplary configuration of an EUV light generation system according to a sixth embodiment of the present disclosure.

FIG. 30 is a partial sectional view illustrating an exemplary configuration of an EUV light generation system according to a sixth embodiment of the present disclosure. In the sixth embodiment, a target may first be irradiated with a pre-pulse laser beam to thereby be diffused, and this diffused target may then be irradiated with a main pulse laser beam to thereby be turned into plasma. For example, a yttrium aluminum garnet (YAG) laser apparatus may be used to output a pre-pulse laser beam at a wavelength of 1.06 µm, and a carbon-dioxide ($CO_2$) laser apparatus may be used to output a main pulse laser beam at a wavelength of 10.6 µm.

As shown in FIG. 30, a pre-pulse laser apparatus 3a and a main pulse laser apparatus 3b may be provided in the sub-fab floor.

In a region across the sub-fab floor and the clean room floor, the laser beam direction control unit 34 may include a beam delivery unit 50a. The configuration and the operation of the beam delivery unit 50a may be similar to the configuration and the operation of the beam delivery unit 50 in the first embodiment. In the clean room floor, the laser beam direction control unit 34 may include a high-reflection mirror 59a. The beam delivery unit 50a and the high-reflection mirror 59a may be provided to control a direction in which the pre-pulse laser beam from the pre-pulse laser apparatus 3a travels.

In a region across the sub-fab floor and the clean room floor, the laser beam direction control unit 34 may further include a beam delivery unit 50b. The configuration and the operation of the beam delivery unit 50b may be similar to the configuration and the operation of the beam delivery unit 50 in the first embodiment. In the clean room floor, the laser beam direction control unit 34 may include a high-reflection mirror 59b. The beam delivery unit 50b and the high-reflection mirror 59b may be provided to control a direction in which the main pulse laser beam from the main pulse laser apparatus 3b travels.

The high-reflection mirror 59a may be configured to reflect the pre-pulse laser beam with high reflectance. The high-reflection mirror 59b may be configured to reflect the main pulse laser beam with high reflectance. The pre-pulse laser beam reflected by the high-reflection mirror 59a may be incident on a first surface of the beam splitter 56. The main pulse laser beam reflected by the high-reflection mirror 59b may be incident on a second surface of the beam splitter 56.

The beam splitter 56 may be positioned to reflect the pre-pulse laser beam incident on the first surface thereof toward the high-reflection mirror 61 with high reflectance and transmit a part of the pre-pulse laser beam incident on the first surface thereof toward the first beam monitor 57.

Further, the beam splitter 56 may be positioned to transmit the main pulse laser beam incident on the second surface thereof toward the detector 61 with high transmittance and reflect a part of the main pulse laser beam incident on the second surface thereof toward the first beam monitor 57.

The photosensitive surface of the first beam monitor 57 may have sensitivity to both the pre-pulse laser beam and the main pulse laser beam.

The beam splitter 56 may serve as a beam combiner for controlling the direction in which the pre-pulse laser beam travels and the direction in which the main pulse laser beam travels to coincide with each other. The beam splitter 56 may be formed of diamond.

The high-reflection mirror 61 may reflect the pre-pulse laser beam and the main pulse laser beam from the beam splitter 56 with high reflectance.

The pre-pulse laser beam and the main pulse laser beam reflected sequentially by the high-reflection mirror 61 may be transmitted through the window 66 with high transmittance and be reflected by the flat mirror 62 with high reflectance. Thereafter, the pre-pulse laser beam and the main pulse laser beam may be reflected by the laser beam focusing mirror 220 and focused in the plasma generation region 25.

According to the sixth embodiment, even in a case where the pre-pulse laser apparatus 3a and the main pulse laser beam 3b are used, the pre-pulse laser beam and the main pulse laser beam may be controlled respectively based on a detection result of a beam monitor.

First and second guide laser devices may further be provided to output first and second guide laser beams for the pre-pulse laser beam and the main pulse laser beam, respectively. The control of the wavefront adjuster using a guide laser beam may be similar to that described above.

9. Configuration of Controller

Those skilled in the art will recognize that the subject matter described herein may be implemented by a general purpose computer or a programmable controller in combination with program modules or software applications. Generally, program modules include routines, programs, components, data structures, and so forth that can perform process as discussed in the present disclosure.

Figure 31:
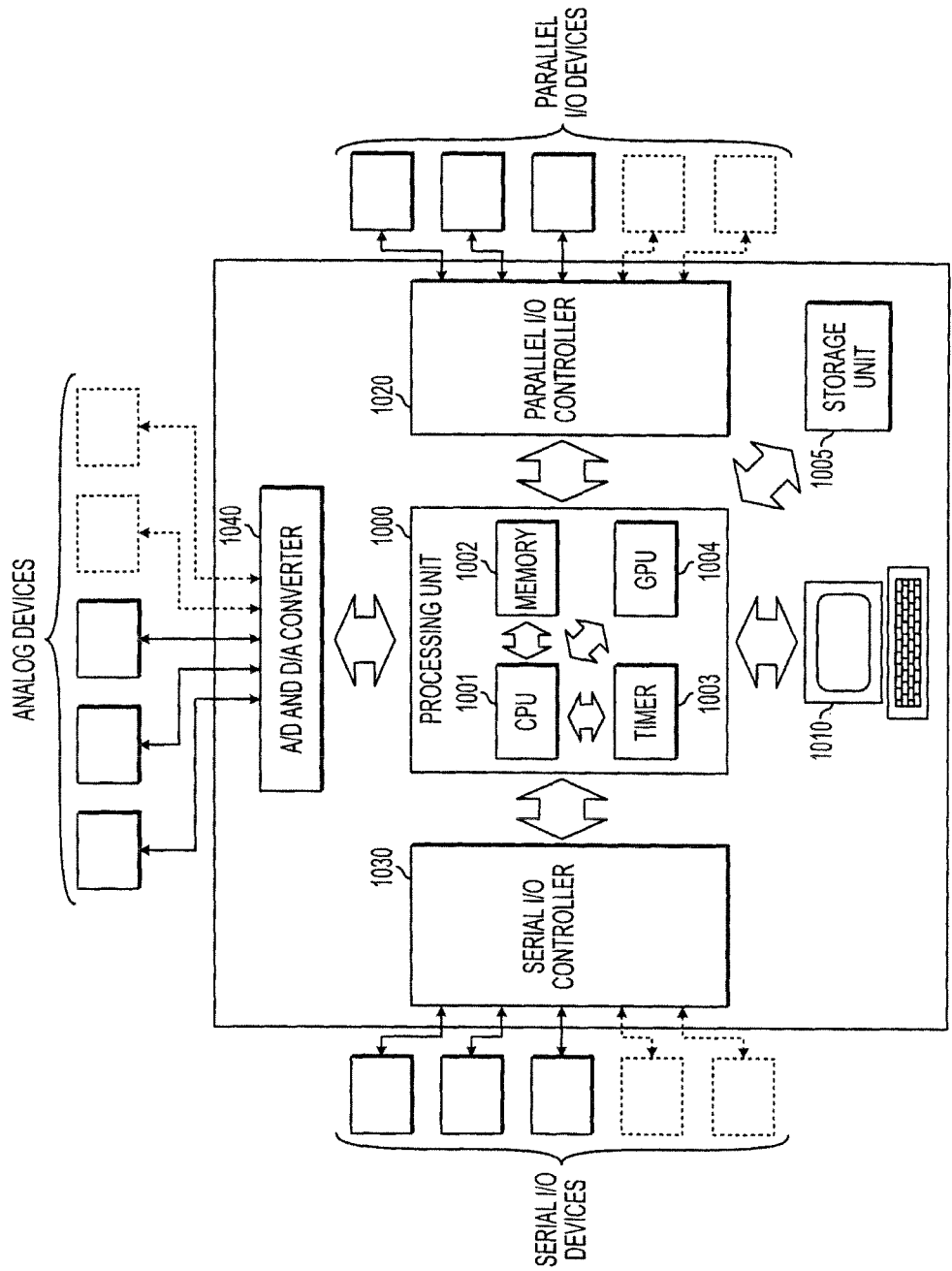
FIG. 31 is a block diagram schematically illustrating an exemplary configuration of a controller.

FIG. 31 is a block diagram showing an exemplary hardware environment in which various aspects of the disclosed subject matter may be implemented. An exemplary environment 100 in FIG. 31 may include, but not limited to, a processing unit 1000, a storage unit 1005, a user interface 1010, a parallel input/output (I/O) controller 1020, a serial I/O controller 1030, and an analog-to-digital (A/D) and digital-to-analog (D/A) converter 1040.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any of various commercially available processors. Dual microprocessors and other multi-processor architectures may also be employed as the CPU 1001.

These components in FIG. 31 may be interconnected to one another to perform the processes discussed in the present disclosure.

In operation, the processing unit 1000 may load programs stored in the storage unit 1005 to execute them, read data from the storage unit 1005 in accordance with the programs, and write data in the storage unit 1005. The CPU 1001 may execute the programs loaded from the storage unit 1005. The memory 1002 may be a work area to temporally store programs to be executed by the CPU 1001 and data to be used for the operations of the CPU 1001. The timer 1003 may measure time intervals to provide the CPU 1001 with a measured result in accordance with the execution of the program. The GPU 1004 may process image data and provide the CPU 1001 with a processing result, in accordance with a program to be loaded from the storage unit 1005.

The parallel I/O controller 1020 may be coupled to parallel I/O devices, such as the first and second beam monitors 47 and 57 and the EUV light generation controller 5, which can communicate with the processing unit 1000, and control communication between the processing unit 1000 and those parallel I/O devices. The serial I/O controller 1030 may be coupled to serial I/O devices, such as the guide laser device 40, the laser beam direction adjusting mechanism 41, the first and second beam monitors 47 and 57, beam delivery unit 50, the first through third wavefront adjusters 81 through 83, and the guide laser beam wavefront adjuster 84, which can communicate with the processing unit 1000, and control communication between the processing unit 1000 and those serial I/O devices. The A/D and D/A converter 1040 may be coupled to analog devices such as a temperature sensor, a pressure sensor, and a vacuum gauge, through analog ports.

The user interface 1010 may display progress of executing programs by the processing unit 1000 for an operator so that the operator can instruct the processing unit 1000 to stop execution of the programs or to execute an interruption routine.

The exemplary environment 100 can be applicable to implement each of the EUV light generation controller 5 and the controllers 48 and 58 in the present disclosure. Persons skilled in the art will appreciate that those controllers can be implemented in distributed computing environments where tasks are performed by processing units that are linked through any type of a communications network. As discussed in the present disclosure, the EUV light generation controller 5 and the controllers 48 and 58 can be connected to each other through a communication network such as Ethernet. In a distributed computing environment, program modules may be located in both local and remote memory storage devices.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more."

What is claimed is:

1. A device for controlling a laser beam, comprising:
a first wavefront adjuster provided in a beam path of a laser beam outputted from a laser apparatus;
a beam delivery unit provided in a beam path of the laser beam from the first wavefront adjuster;
a second wavefront adjuster provided in a beam path of the laser beam from the beam delivery unit;
a beam monitor provided in a beam path of the laser beam from the second wavefront adjuster, the beam monitor configured to output a detection result; and
a controller configured to control the first wavefront adjuster based on a beam width calculation and the second wavefront adjuster based on a beam spot width calculation, with each calculation based on the detection result of the beam monitor.

2. The device according to claim 1, further comprising:
a guide laser device configured to output a guide laser beam; and
a beam combiner provided in a beam path of the laser beam between the laser apparatus and the first wavefront adjuster to control at least one of a travel direction of the guide laser beam and a travel direction of the laser beam to substantially coincide with each other.

3. The device according to claim 2, further comprising:
a third wavefront adjuster provided in a beam path of the laser beam between the laser apparatus and the beam combiner, wherein
the controller is configured to control the third wavefront adjuster based on the detection result of the beam monitor.

4. The device according to claim 2, further comprising:
a third wavefront adjuster provided between the guide laser device and the beam combiner and configured to adjust a wavefront of the guide laser beam; and
a second beam monitor provided between the beam combiner and the first wavefront adjuster and configured to receive a part of a laser beam from the first wavefront adjuster and output a detection result of the received laser beam, wherein the controller is configured to control the third wavefront adjuster based on the detection result of the second beam monitor.

5. The device according to claim 2, further comprising:
an amplifier provided between the beam combiner and the beam delivery unit.

6. The device according to claim 1, wherein the controller controls the second wavefront adjuster based on a wavefront curvature of the laser beam detected by the beam monitor.

7. An apparatus for generating extreme ultraviolet light, comprising:
the laser beam control device according to claim 1;
a chamber provided with an inlet to allow the laser beam from the laser beam control device to enter the chamber therethrough;
a target supply device for supplying a target material into the chamber; and
a laser beam focusing optical system for focusing the laser beam in the chamber.

8. The device according to claim 1, wherein the beam monitor includes:
a beam splitter configured to split the laser beam into a first beam and a second beam;
a first beam profiler provided in a beam path of the first beam;
a second beam profiler provided in a beam path of the second beam;
a transfer optical system provided between the beam splitter and the first beam profiler; and
a focusing optical system provided between the beam splitter and the second beam profiler.

9. The device according to claim 8, wherein the beam monitor is configured to measure the beam width based on an output of the first beam profiler.

10. The device according to claim 9, wherein the controller is configured to control the first wavefront adjuster so that a subsequent instance of a difference between the beam width measured by the beam monitor and a target beam width approaches 0.

11. The device according to claim 8, wherein the beam monitor is configured to measure the beam spot width focused by the focusing optical system based on an output of the second beam profiler.

12. The device according to claim 11, wherein the controller is configured to control the second wavefront adjuster so that a subsequent instance of the beam spot width measured by the beam monitor becomes smaller than a current instance thereof.

13. The device according to claim 1, wherein the beam monitor includes:
a beam splitter configured to split the laser beam into a first beam and a second beam;
a first beam profiler provided in a beam path of the first beam;
a second beam profiler provided in a beam path of the second beam;
a first transfer optical system provided between the beam splitter and the first beam profiler; and
a second transfer optical system provided between the beam splitter and the second beam profiler.

14. The device according to claim 13, wherein the controller is configured to control the first wavefront adjuster based on an output of the first beam profiler and control the second wavefront adjuster based on an output of the first beam profiler and an output of the second beam profiler.

15. The device according to claim 1, wherein the beam monitor includes a Shack-Hartmann wavefront sensor.

16. The device according to claim 1, wherein the beam monitor includes movable band-pass filters.

17. The device according to claim 1, further comprising:
a guide laser device configured to output a guide laser beam; and
a beam combiner provided in a beam path of the laser beam between the first wavefront adjuster and the second wavefront adjuster to control at least one of a travel direction of the guide laser beam and a travel direction of the laser beam to substantially coincide with each other.

* * * * *